US011101677B2

(12) United States Patent
Shih et al.

(10) Patent No.: US 11,101,677 B2
(45) Date of Patent: *Aug. 24, 2021

(54) SYSTEMS AND METHODS FOR DETERMINING AND MANAGING BATTERY CHARGING RULES

(71) Applicant: Gogoro Inc., Hong Kong (CN)

(72) Inventors: I-Fen Shih, New Taipei (TW); Yun-Chun Lai, Hsinchu (TW); Sheng-Chin Chuang, New Taipei (TW); Daniel Vickery, Ipswich, MA (US); Hok-Sum Horace Luke, Mercer Island, WA (US)

(73) Assignee: Gogoro Inc., Hong Kong (CN)

(*) Notice: Subject to any disclaimer, the term of this patent is extended or adjusted under 35 U.S.C. 154(b) by 253 days.

This patent is subject to a terminal disclaimer.

(21) Appl. No.: 16/236,036

(22) Filed: Dec. 28, 2018

(65) Prior Publication Data
US 2019/0207393 A1 Jul. 4, 2019

Related U.S. Application Data

(60) Provisional application No. 62/612,160, filed on Dec. 29, 2017.

(51) Int. Cl.
H01M 10/44 (2006.01)
H01M 10/46 (2006.01)
(Continued)

(52) U.S. Cl.
CPC .............. H02J 7/007 (2013.01); B60L 53/53 (2019.02); B60L 53/68 (2019.02); B60L 53/80 (2019.02);
(Continued)

(58) Field of Classification Search
CPC ...... H02J 7/007; H02J 7/0071; H02J 7/00047; H02J 7/0047; H02J 7/0003; B60L 53/68;
(Continued)

(56) References Cited

U.S. PATENT DOCUMENTS

2007/0184339 A1* 8/2007 Scheucher .............. B60L 50/66
429/99
2015/0039391 A1* 2/2015 Hershkovitz .......... G06Q 50/30
705/7.31
(Continued)

FOREIGN PATENT DOCUMENTS

CN 103814394 A 5/2014
CN 105493378 A 4/2016
(Continued)

OTHER PUBLICATIONS

Japanese Office Action received for copending Japanese Patent Application No. JP2018-245520; Applicant: Gogoro Inc., dated Jan. 28, 2020, 7 pages.
(Continued)

Primary Examiner — Edward Tso
(74) Attorney, Agent, or Firm — Perkins Coie LLP

(57) ABSTRACT

The present disclosure relates to methods and associated systems for charging exchangeable energy storage devices positioned in a device-exchange station. The method includes, for example, (1) receiving demand information; (2) determining a charging plan for the device-exchange station at least partially based on a state-of-charge (SoC) of each of the exchangeable energy storage devices positioned in the device-exchange station, the demand information, and an available power of the device-exchange station; (3) generating a charging command for each of the exchangeable energy storage devices based on the charging rule for each of the exchangeable energy storage devices; and (4) trans-
(Continued)

mitting the charging commands to the device-exchange station.

20 Claims, 9 Drawing Sheets

(51) Int. Cl.
H02J 7/00 (2006.01)
B60L 53/80 (2019.01)
G01R 31/396 (2019.01)
G01R 31/382 (2019.01)
B60L 53/68 (2019.01)
B60L 53/53 (2019.01)
B60L 58/12 (2019.01)
G06Q 30/02 (2012.01)
G06Q 50/06 (2012.01)

(52) U.S. Cl.
CPC ......... *G01R 31/382* (2019.01); *G01R 31/396* (2019.01); *H02J 7/0027* (2013.01); *H02J 7/0045* (2013.01); *H02J 7/0071* (2020.01); *B60L 58/12* (2019.02); *G06Q 30/0202* (2013.01); *G06Q 50/06* (2013.01)

(58) Field of Classification Search
CPC .......... B60L 58/12; Y02T 90/12; Y02T 90/16; B60Y 2200/91; Y02E 60/12; G01R 31/396; G01R 31/3648; G01R 31/3651; G01R 31/3624
USPC .......... 320/103, 107, 109, 132, 149; 701/22, 701/400, 424
See application file for complete search history.

(56) References Cited

U.S. PATENT DOCUMENTS

| 2016/0254671 A1* | 9/2016 | Cutright | H02J 7/0068 700/295 |
| 2019/0207398 A1* | 7/2019 | Shih | H02J 7/0045 |

FOREIGN PATENT DOCUMENTS

| CN | 205862454 U | 1/2017 |
| EP | 2724886 A1 | 4/2018 |
| EP | 3379467 A1 | 9/2018 |
| JP | 2011-087430 A | 4/2011 |
| JP | 2011-132020 A | 7/2011 |
| JP | 2014-524618 A | 9/2014 |
| JP | 2015-015827 A | 1/2015 |
| KR | 20130044166 A | 5/2013 |
| TW | 201719551 A | 6/2017 |
| WO | 2013024484 A1 | 2/2013 |
| WO | 2017086173 A1 | 5/2017 |
| WO | 2017086174 A1 | 5/2017 |

OTHER PUBLICATIONS

Office Action received for Taiwanese Patent Application No. TW107147255; Applicant: Gogoro Inc., dated Sep. 19, 2019, 11 pages.
European Search Report Received for European Patent Application No. EP 18248287.7; Applicant: Gogoro Inc., dated Apr. 1, 2019, 4 pages.
European Office Action Received for European Patent Application No. EP 18248287.7; Applicant: Gogoro Inc., dated Apr. 15, 2019, 7 pages.
Notice of Publication received for copending Philippine Patent Application No. PH1/2019/000007; Applicant: Gogoro Inc., dated Jul. 24, 2019, 3 pages.
Indian Office Action received for co-pending Indian Patent Application No. IN201814049175; Applicant; Gogoro Inc.; dated Sep. 28, 2020, 5 pages.

* cited by examiner

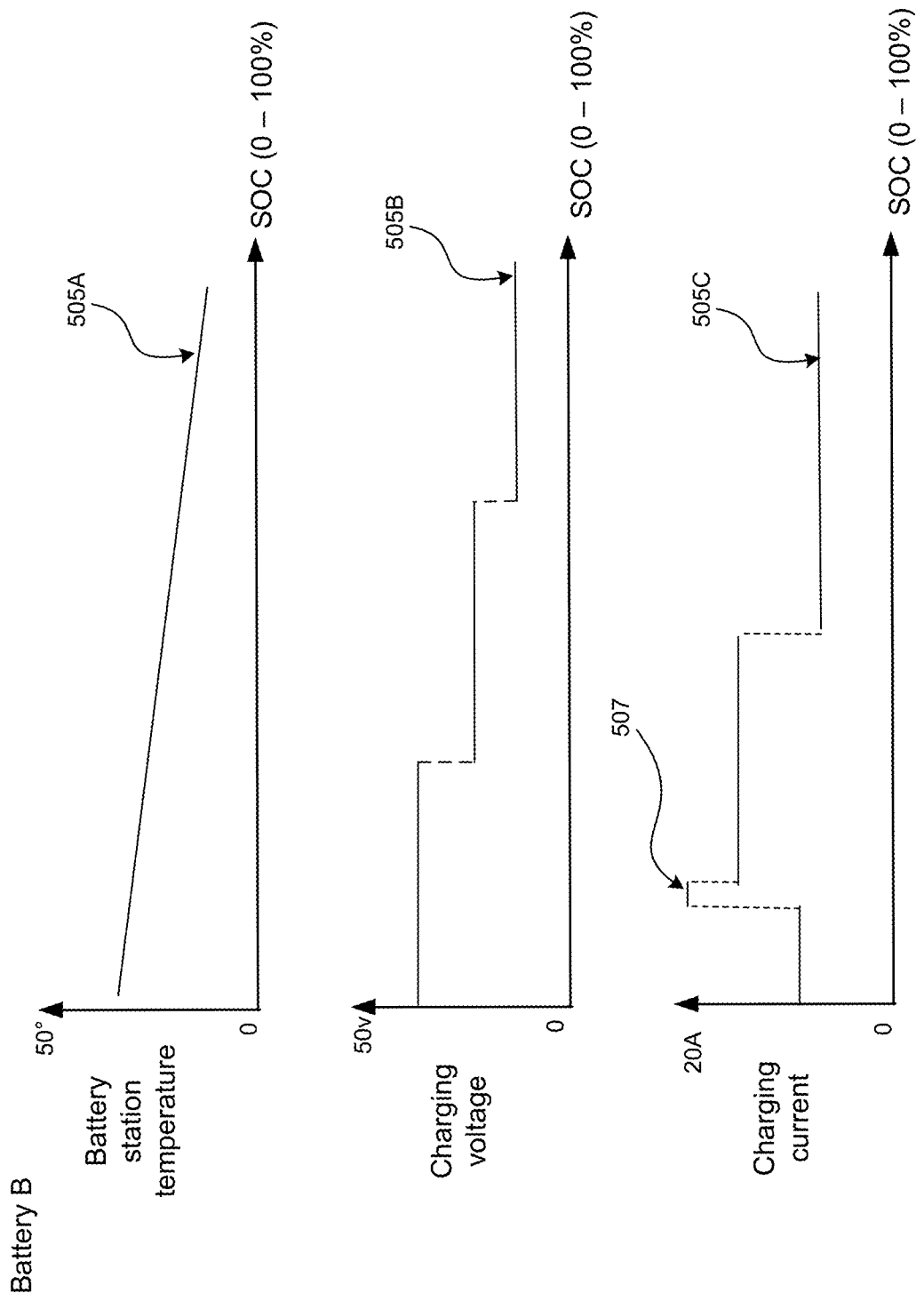

SYSTEMS AND METHODS FOR DETERMINING AND MANAGING BATTERY CHARGING RULES

The present application claims the benefit of and priority to U.S. Provisional Application No. 62/612,160, filed Dec. 29, 2017, which is incorporated herein by reference in its entirety.

TECHNICAL FIELD

The present technology is directed to systems and methods for determining and managing charging rules of an exchangeable energy storage device positioned in a storage-device exchange station.

BACKGROUND

Many factors may affect a rechargeable battery's performance and life span, such as, the operating or charging conditions thereof. For an exchangeable battery system that handles a large number of exchangeable batteries (which may include various types of batteries), it is difficult to know how to properly charge each of the batteries so as to maintain its best possible performance. It is even more difficult when these exchangeable batteries are deployed and have been used by various users under different operating conditions. Improper charging can negatively impact a battery's energy-efficiency and life span. Therefore, it is advantageous to have an improved system and method to address this issue.

BRIEF DESCRIPTION OF THE DRAWINGS

Embodiments of the disclosed technology will be described and explained through the use of the accompanying drawings.

FIGS. 5A-5C are schematic diagrams illustrating battery charging characteristics or patterns in accordance with embodiments of the disclosed technology.

Figure 1:
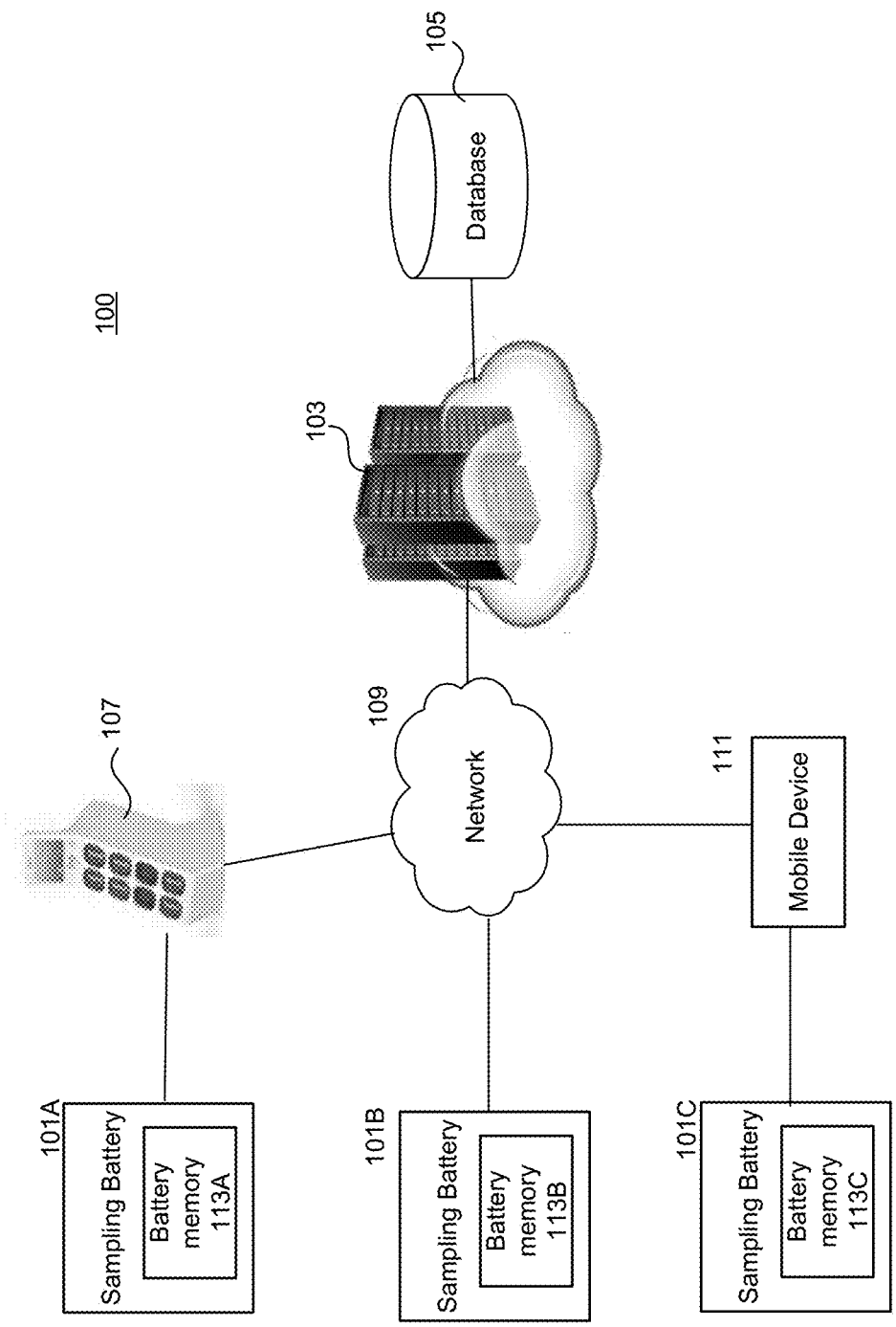
FIG. 1 is a schematic diagram illustrating a system in accordance with embodiments of the disclosed technology. The system is configured to collect information from multiple sampling batteries.

The drawings are not necessarily drawn to scale. For example, the dimensions of some of the elements in the figures may be expanded or reduced to help improve the understanding of various embodiments. Similarly, some components and/or operations may be separated into different blocks or combined into a single block for the purposes of discussion of some of the embodiments. Moreover, although specific embodiments have been shown by way of example in the drawings and described in detail below, one skilled in the art will recognize that modifications, equivalents, and alternatives will fall within the scope of the appended claims.

DETAILED DESCRIPTION

In this description, references to "some embodiments," "one embodiment," or the like, mean that the particular feature, function, structure or characteristic being described is included in at least one embodiment of the disclosed technology. Occurrences of such phrases in this specification do not necessarily all refer to the same embodiment. On the other hand, the embodiments referred to are not necessarily mutually exclusive.

The present technology is directed to systems and methods for charging (or managing) exchangeable energy storage devices positioned in a device-exchange station. In some embodiments, the device-exchange station can be a battery-exchange station. In some embodiments, the device-exchange station can be a public station (e.g., to serve general users who subscribe a battery exchange plan, a semi-private station (e.g., to serve a particular group of users, such as users in a corporation, a school, a delivery fleet, etc.), or a private station (e.g., to serve a private group of users such as a household). The present technology can provide, based on a predicted exchange demand, a "charging plan" for the battery-exchange station to charge the batteries therein. In the present disclosure, the "charging plan" refers to a set of instructions (e.g., generated by a server) sent to the battery-exchange station, and the instructions that are informative regarding how to charge one or more batteries therein so as to meet a predicted exchange demand. An "overall charging plan" refers to instructions for a server to manage multiple stations and charge the batteries therein. The predicted exchange demand can be predictions on exchanges of batteries/battery usages during the following time periods, such as, 2 batteries to be picked up by a user in 2 hours, 4 batteries to be picked up by another two users in 4 hours, etc. In some embodiments, the system includes a plurality of device-exchange stations connected to a server. The predicted exchange demands are calculated/derived for each of the device-exchange stations by the server based on the empirical information regarding exchange information and predicted exchange information in the past. The server may store and maintain (e.g., update periodically based on new coming data) the predicted exchange demands of the device-exchange stations as the demand information in a memory of the server (or a database connected to the server). By this arrangement, the present technology can effectively prepare exchangeable energy storage devices to meet the predicted demand (e.g., without wasting energy to charge, discharge, or maintain a battery that is not to be picked up in a near future, according to the predicted demand). The exchangeable energy storage devices can be used for powering vehicles, mobile devices, etc. The exchangeable energy storage devices can also be used to power to households or the places that do not have mains electricity coverage.

In addition to forming charging plans based on the predicted demand, one embodiment of the present technology also determines the charging plan based on one or more characteristics of the batteries (e.g., the "battery information" discussed below). In other words, these batteries can be prepared/charged based on particular "charging rules" or "charging profiles" that correspond to characteristics thereof. For example, the charging rules can define how to charge a particular battery with certain amount of current at a specific voltage for a period of time. The charging rules can vary based on one or more of the characteristics of the batteries together with the demand prediction (e.g., with the knowledge of how a battery ages or degrades as well as a predicted demand, the system knows how to charge the battery by selecting suitable charging rules/profiles). By this arrangement, the present technology can increase the lives of the batteries by selecting suitable charging rules to charge/discharge the same (e.g., not to charge a battery in a (relatively) fast charging process unless necessary so as to mitigate or reduce battery degradation). In some embodiments, the charging rules can be stored in a server. The server can manage, maintain, and update these charging rules periodically or in response to a triggering event. In some embodiments, the triggering event includes an exchange of the exchangeable energy storage devices positioned in the device-exchange station, a change to the available power, a change to demand information, and/or a reservation for the exchangeable energy storage devices positioned in the device-exchange station.

In the present disclosure, once the suitable "charging rules" (or "charging profiles") are determined, the system (e.g., a server) can generate a corresponding set of "charging commands" and then transmit these charging commands to the battery-exchange station for implementation. To elaborate, for example, the charging command is a command specifying how to charge a particular battery at a certain charging rate. The charging commands can be updated periodically (e.g., by the server) based on the charging rules selected for each of the exchangeable energy storage devices and be sent to the multiple device-exchange stations. For example, the state (e.g., SoC/temperature) of a battery can change with time, and accordingly the charging commands will be updated.

In some embodiments, the present method can include, for example, (1) receiving demand information (e.g., a plurality of predicted exchange demands) for a device-exchange station; (2) determining a charging plan for the device-exchange station at least partially based on a state-of-charge (SoC) of each of the exchangeable energy storage devices positioned in the device-exchange station, the demand information, and an available power of the device-exchange station; (3) generating a charging command for each of the exchangeable energy storage devices based on the charging rule; and (4) transmitting the charging command to the device-exchange station. The "charging plan" includes "charging rules" selected or customized for each of energy storage devices positioned in the device-exchange stations based on the characteristics of the batteries and demand information, and the "charging commands" are generated based on the corresponding "charging rules." For example, a server can manage multiple device-exchange stations connected thereto by sending charging commands or the like to each of the stations. Description below discusses embodiments regarding how to generate/select the "charging rules."

The present technology is also directed to systems and methods for determining and managing charging rules of an exchangeable battery based on analyzing multiple sampling batteries with similar or the same characteristics of the exchangeable battery. The present disclosure relates to a method and system for determining and managing charging rules for exchangeable energy storage devices (e.g., batteries) positioned in an energy-storage-device exchange station. More particularly, the present system provides a customized battery charging rule (e.g., it describes how and when an exchangeable battery positioned in a battery-exchange station should be charged and can include charging patterns). Based on the customized battery charging rules (e.g., determined based on one or more characteristics, features, and/or patterns of the exchangeable battery), the battery can be charged to achieve one or more objectives such as increasing/maximizing battery life spans, enhancing battery performances, and/or improving energy efficiency.

To achieve the foregoing objectives, the present system can first collect information from multiple sampling batteries. In some embodiments, the sampling batteries can include exchangeable batteries that are currently deployed in a battery-exchange marketplace. For example, the sampling batteries can include batteries that have been used by a user (e.g., a battery plan subscriber) to power the user's electric vehicle. In some embodiments, the sampling batteries can include batteries not yet on the market (e.g., those that are tested or stored in factories, warehouses, laboratories, etc.). In some embodiments, the disclosed system can collect information from multiple sources (e.g., battery exchange stations, electric vehicles, batteries, user mobile devices, etc.). In some embodiments, the disclosure system can collect information from a database.

The present system is configured to collect various types of battery information, such as, one or more of (1) battery manufacturing information, (2) battery characteristic information, (3) battery charging information, (4) battery usage information, and (5) other suitable battery information (e.g., a unique battery identity serial number created by a battery exchange plan provider for tracking or administrative purposes). Through analyzing these sets of information and comparing the analysis results (e.g., as reference information) with the characteristics of a battery (i.e., the above-described types of battery information that this battery may be) to be charged, the present system can better understand the battery to be charged, and therefore is able to generate a detailed, customized charging rule for that battery.

Examples of the battery manufacturing information include battery manufacturers (e.g., batteries made by different manufacturers may have different characteristics, although their battery specifications may be the same), manufacturing dates (e.g., batteries made on different dates may have different characteristics), manufacturing batches (e.g., batteries made in different batches may still have different characteristics), hardware versions, firmware versions, cell types, and/or manufacturing serial numbers (e.g., batteries made in a batch can still have different characteristics).

Examples of the battery characteristic information include a battery capacity (e.g., full charge capacity, FCC), a battery discharging capacity (e.g., how much current can a battery provide under certain conditions), state-of-health (SOH), and/or a suggested battery working temperature (e.g., a temperature range such as 5 to 35 degrees Celsius).

Examples of the battery charging information include current state of charge (SOC) information, current battery temperature information, current cell temperature information, current circuit temperature information, error status information (e.g., an error or a warning message produced by a battery management system (BMS) in the battery responsive to an abnormal charge or discharge event), a suggested battery charging temperature (e.g., a temperature range such as 25 to 40 degrees Celsius), a suggested battery charging current (e.g., a constant or regulated current), a suggested battery charging voltage (e.g., a constant or regulated voltage), a suggested battery charging cycle (e.g., at least one full charging per week), a suggested battery charging speed (e.g., increasing from zero to 10% of the full capacity of a battery in 5 minutes), and/or a suggested battery charging time (e.g., not to be continuously charged for more than 5 hours).

Examples of battery usage information include battery age information (e.g., use time and/or cycle count), a battery direct current internal resistance (DCIR) information, an actual battery charging temperature (e.g., a battery was charged yesterday at 30 degrees Celsius and at 35 degrees Celsius earlier today for 25 minutes), an actual battery charging current (e.g., 1-200 Amperes), an actual battery charging voltage (e.g., 1-220 volts), an actual battery charging cycle (e.g., a battery has been through 50 full charge cycles and 125 partial cycles), an actual battery charging speed or charging rate (e.g., 20 Amperes per hour), an actual battery charging time (e.g., a battery was charged for 56 minutes yesterday), an actual battery working temperature (e.g., a battery was operating at 35 degrees Celsius yesterday for 2 hours), and an actual battery discharging time (e.g., a battery discharges at its full current capacity for 66 minutes yesterday).

Examples discussed above are only embodiments of the present disclosure. In other embodiments or implementations, the present system can collect other types of information to support its analysis for customized battery charging rules. For example, the system of the present technology can collect environmental information (e.g., weather forecast) or other suitable information (e.g., a power outage notice from a power source used for charging, a fee schedule of a power source, an event notice indicating there will be an event held near a battery exchange station in two days, etc.) that can potentially affect a charging process for the battery to be charged. In some embodiments, the fee schedule of a power source can indicate different fees by drawing power during various time periods, so the charging rules for the batteries in one battery exchange station can be selected/customized based on the above-described economic condition.

Figure 5A:
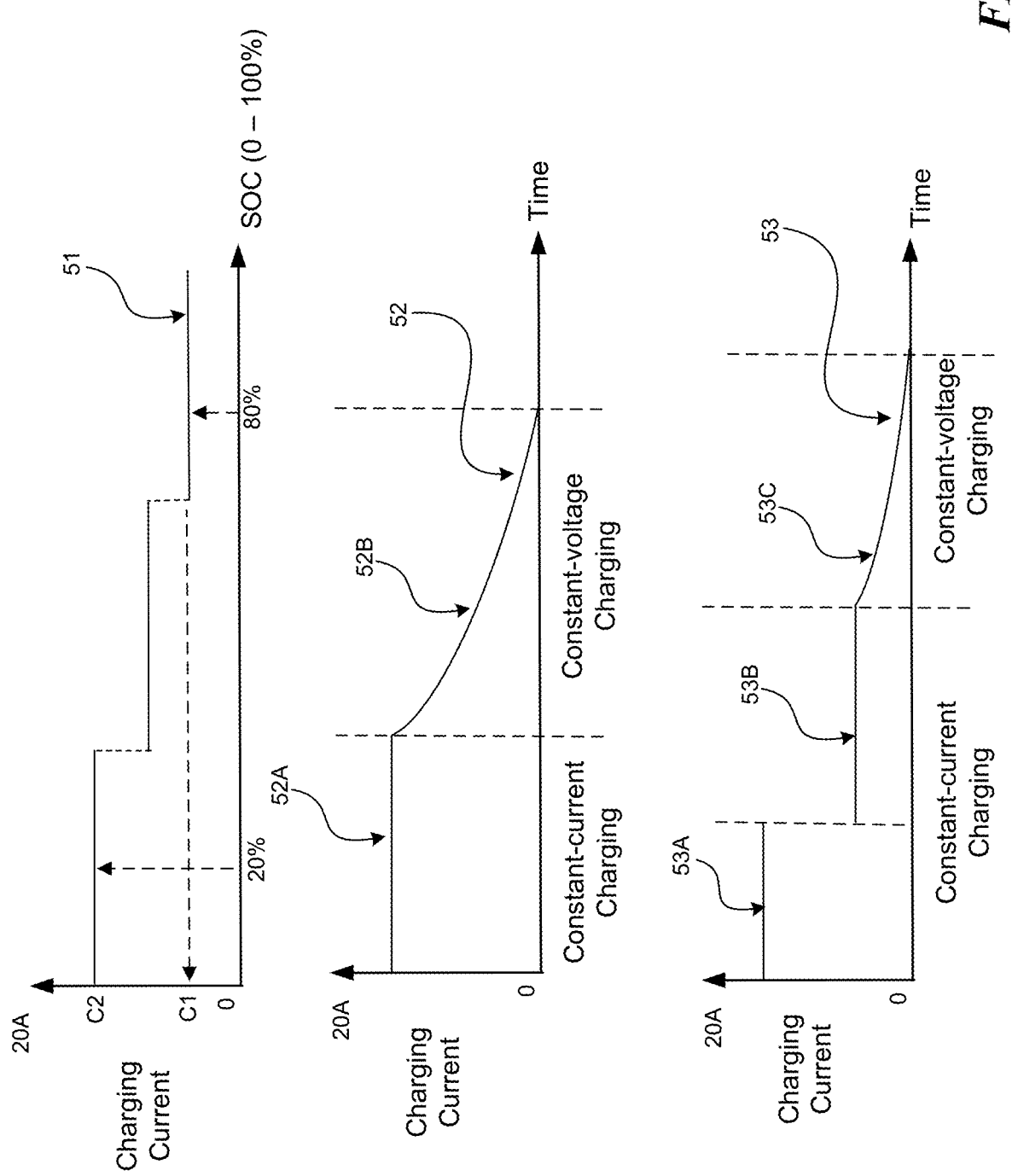
Figure 5B:
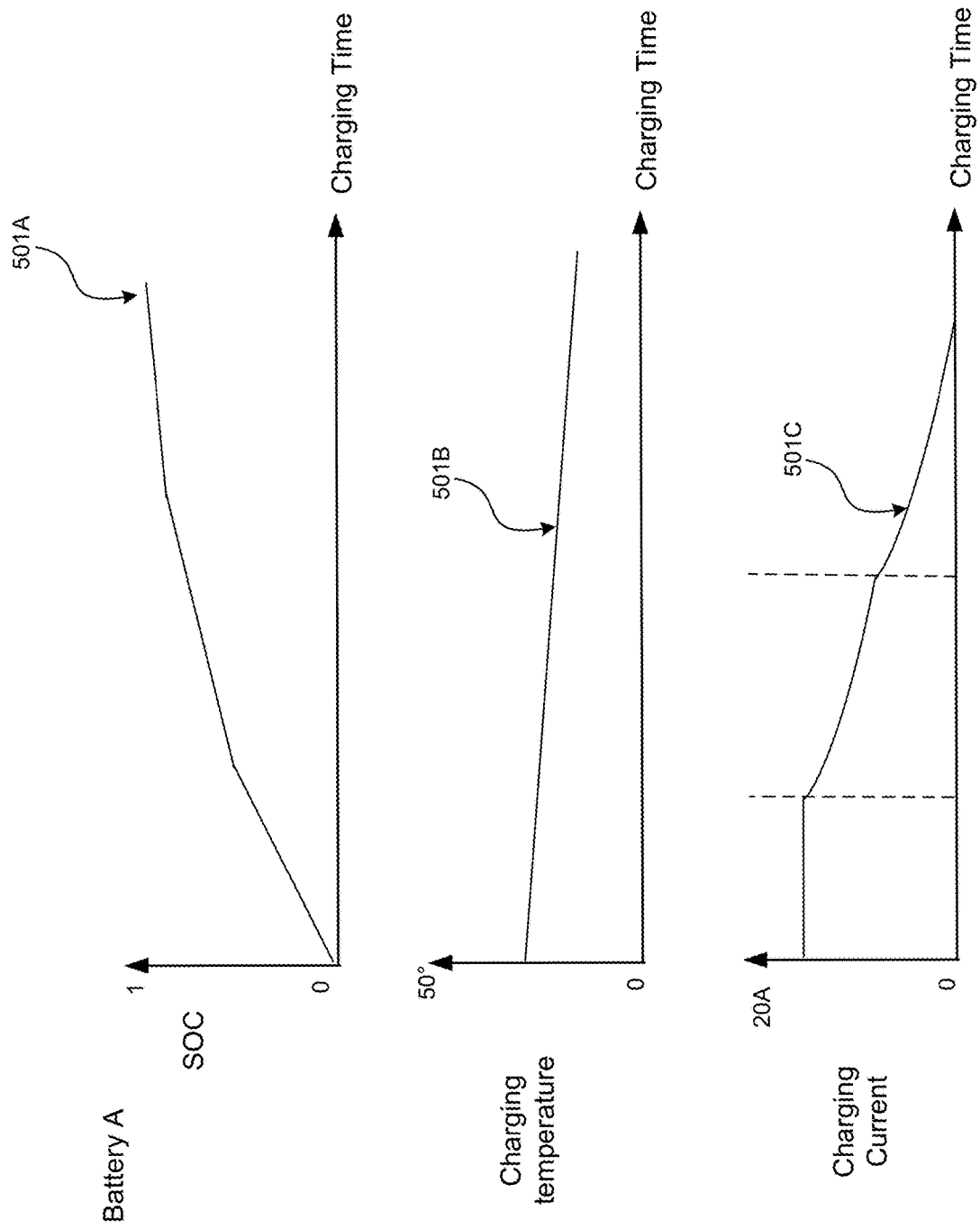

In some embodiments, system of the present technology analyzes the collected information and generates or identifies a set of charging patterns for various types of batteries (e.g., as the characteristic curves/lines shown in FIGS. 5A-5C). The generated or identified patterns can then be used as "reference information" or guidance for charging one or more batteries to be charged to achieve an objective or goal. For example, based on the analysis, the present technology can generate a customized charging rule that can maintain the maximum capacity of a particular type of battery as long as possible. As another example, the present technology can generate a customized charging rule that can increase/maximize the life span of a type of battery. In some embodiments, the present technology can generate a customized charging rule that enables a specific type of battery to have a maximum number of charging cycles (e.g., after 500 charging cycles, the battery can still have 90% of its original capacity). In other embodiments, the present technology can have other types of suitable objectives (e.g., customer satisfaction, battery performance, user experience, etc.).

In some embodiments, the customized battery charging rule can be selected from two or more candidate charging rules (e.g., the system can include 10 commonly-used charging patterns as the candidate charging rules). For example, the disclosed system can generate a set of candidate charging rules for a system operator to select from. For example, the disclosed system can have a set of candidate charging rules based on "battery health" (e.g., charging cycles or possible degradation). Battery "degradation" can mean a decrease of its full charge capacity (FCC) after charging/discharging. For example, the set of candidate charging rules based on "battery health" can include: (1) for batteries with 90-100% FCC (e.g., minor or no degradation) or within 500 charging cycles, the system will stop charging these batteries when their battery cell temperatures exceed a threshold value (e.g., 50° C.); (2) for batteries with 80-90% FCC (e.g., acceptable degradation) or within 500-700 charging cycles, the system can keep charging these batteries when their battery cell temperatures range from, for example, 50° C. to 55° C., if the system determines that a battery demand is high (e.g., to sacrifice the "battery health" to fulfill the battery demand); and (3) for batteries with less than 80% FCC or beyond 700 charging cycles, the system will charge these batteries with a relative low current and start planning to remove such batteries from the system.

In some embodiments, the set of candidate charging rules can be designed to achieve one or more "battery health" goals. For example, the disclosed system can provide three default candidate charging rules (i.e., Rules A, B, and C) for a system operator to choose from. Rule A can be designed to achieve the highest possible battery healthy. For example, if Rule A is implemented to charge a battery, the battery is expected to have a minor degradation (e.g., a 5%-10% decrease of its FCC) after 700 charging cycles. Rule B can be designed to achieve an intermediate battery-healthy goal. For example, if Rule B is implemented to charge a battery, the battery is expected to have a minor degradation (e.g., a 5%-10% decrease of its FCC) after 500 charging cycles (e.g., fewer than Rule A). Rule C can be designed to achieve a strategic goal (e.g., to fulfill battery demands) and maintain the battery health at an acceptable level. For example, if Rule C is implemented to charge a battery, the battery is expected to have a greater degradation (e.g., a 10%-15% decrease of its FCC) after 500 charging cycles.

In the embodiments discussed above, Rule A can charge the battery with a relative low current for a relatively long time, compared to Rules B and C. For example, Rule A only allows a maximum 10-Ampere charging current, whereas Rule B allows a maximum 15-Ampere charging current. For example, Rule A needs one hour to complete a charging cycle from 20% FCC to 95% FCC, whereas Rule C only needs a half hour to do so.

The temperature thresholds for Rules A, B, and C can be different. For example, the temperature threshold for Rule A is 45°, the temperature threshold for Rule B is 52° C., and the temperature threshold for Rule C is 55° C. The reference factors, thresholds and logic of charging rules (e.g., Rules A, B and C) can be set or updated based on (1) system preference information; (2) results of statistical analyses; (3) results of machine training of historical data; (4) simulations of historical/real-time data; and/or (5) results of experiments.

In some embodiments, the candidate charging rules can be determined based on environmental conditions such as an ambient temperature or humidity. For example, the disclosed system can have a set of candidate charging rules that applies to batteries located in a "hot" environment (e.g., over 38° C.), and have another set of candidate charging rules that applies to batteries located in a "cold" environment (e.g., below 10° C.).

In some embodiments, the candidate charging rules can be determined based on predicted battery demands (e.g., within a predetermined time interval such as a hour). For example, the disclosed system can have a set of candidate charging rules that applies to batteries located in a high-demand battery exchange station (e.g., to charge batteries as soon as possible with a relatively high temperature tolerance, such as 55° C.), and have another set of candidate charging rules that applies to batteries located in a low-demand battery exchange station (e.g., not charging when a battery temperature excesses a threshold value). In some embodiments, the predicted battery demands are generated based on analyses involving a clustering process and/or a machine learning process. For example, the disclosed system collects battery demand information (e.g., the number of battery exchanges in the past, battery reservations, user behavior, etc.) from various sampling stations. The system then performs a clustering process (e.g., by a K-means clustering process) to determine multiple demand clusters. The clusters can be characterized by both "station" and a "time interval." For example, Cluster A can represent the battery demand for Station X during 1 a.m. to 4 a.m., Cluster B can represent the battery demand for Station Y during 5 p.m. to 6 p.m., and Cluster C can represent the battery demand for Station Z during 2 a.m. to 4 a.m.

In some embodiments, the disclosed system can perform a "just-in-time" charging process. In such embodiments, the system charges a battery in a relatively slow way (e.g., using lower current for a longer period of time or charging the battery during a time period that charging power is less expensive) until a battery demand is confirmed (e.g., a user reservation or a predicted demand), so that the battery could be fully charged before it is provided to the user). Charging with lower current can result in better battery health and/or longer battery life. Once the battery demand is confirmed, the system can then charge the battery in a relatively fast fashion (e.g., using higher current for a shorter period of time), so as to meet the battery demand. When the confirmed battery demand is a predicted demand, the system can only charge the batteries to meet that demand. For example, Rule B needs one hour to complete a charging cycle from 20% FCC to 95% FCC and is set as a default charging rule for battery exchange station A. In some embodiments, if the next confirmed battery demand at the battery exchange station A is a predicted demand occurring in 4 hours later, then the system can switch to Rule A to slowly charge the batteries so as to keep the battery healthy.

In some embodiments, the disclosed system (e.g., a server) can perform a simulation for a new or an updated battery charging rule, such that a station system can globally or locally determine whether to implement the new or updated battery charging rule. For example, the system can determine that a first battery exchange station was turned offline for regular maintenance. The system then generates an updated battery charging plan (which can include multiple charging rules) for a second battery exchange station close to the first battery exchange station. For example, the system determines that turning the first battery exchange station offline results in an increase of the battery demand for the second battery exchange station. Accordingly, the system sends an updated battery charging plan to the second battery exchange station.

After receiving the updated battery charging plan, the second battery exchange station can perform a simulation for the updated battery charging plan. The simulation is performed as a background process that does not substantially interfere with the implementation of an existing battery management plan. In some embodiments, the simulation includes simulating a charging process for a battery positioned in the second battery exchange station, based on the updated battery charging plan. In some embodiments, the simulation includes simulating whether implementing the updated battery charging plan can generate a sufficient number of charged batteries to meet the actual demand. For example, due to the expected demand increase, the updated battery charging plan requests the second battery station to charge its batteries at an increased charging rate faster than a normal rate (which is used is the existing battery charging plan). After a period of time (e.g., 12 hours), the simulation result is generated (e.g., charging at the increased charging rate results in a 5-degree-Celsius temperature increase for the whole station). The simulation result is then compared to the actual demand. For example, the actual demand indicates that using the normal rate to charge the batteries still meets the actual demand in the past 12 hours (e.g., there was no user waiting for reserved batteries). In such embodiments, the second battery exchange station can determine not to implement the updated battery charging plan.

In some embodiments, the candidate charging rules can be determined based on economic or financial conditions (e.g., costs or expenses associated with charging, such as fees for electricity used to charging, rental fees for placing a device-exchange station on a land, etc.). For example, the disclosed system can have a set of candidate charging rules that applies to batteries located in an area where charging cost varies from time to time (e.g., to charge batteries only at a discounted rate), and have another set of candidate charging rules that applies to batteries located in an area where charging cost remains constant (e.g., able to charge batteries at all time).

In some embodiments, the candidate charging rules can be determined based on the battery reference information (examples are discussed in detail below), such as the number of battery charge cycles, health index, cell type of the batteries, etc. For example, if the system determines that a battery is new (e.g., with a new cell type or packaging mechanism), the system may choose a charging rule with a higher charging current (e.g., since the battery is new, the higher charging current can charge the battery faster without significantly degrading the battery).

In some embodiments, the candidate charging rules can be determined based on a combination of the various factors discussed above. In some embodiments, the disclosed system can generate a default charging rule for a battery exchange station to follow (i.e., a battery exchange station will charge all batteries positioned therein based on this default charging rule). Because the batteries located at the same battery location may have some factors in common (e.g., same environmental condition, battery demands, charging cost, etc.), it can be advantageous (e.g., to save computing resources) for the system to assign the same charging rules to the batteries located in the same battery exchange station. In some embodiments, the assigned charging rules can be further adjusted based on battery-specific information (e.g., to change the assigned default rule based on the characteristic of an inserted battery). In some embodiments, the charging rule can be set according to several factors/conditions with weightings that need not correspond to a condition that is named/understood or controlled/supervised by an operator. In such embodiments, the charging rule can be a series of conditional determinations and may not look like the characteristic curves/lines shown in FIGS. 5A-5C.

In some embodiments, the candidate charging rules can be stored and/or maintained by a server. In such embodiments, the server can send or dispatch updated charging rules or commands to battery exchange stations periodically (e.g., a command such as "to charge the battery at Slot 2 with 200 mA for 10 minutes"). In some embodiments, each battery exchange station can store or maintain a set of default battery charging rules to charge the batteries positioned therein and the set of default battery charging rules could be updated by the server periodically (e.g., daily, weekly, quarterly, etc.).

In some embodiments, when a user inserts a battery into a battery slot of a battery exchange station (namely, a battery exchange at the battery exchange station), the present system (e.g., a battery exchange station or a combination of one or more battery exchange stations and a server) detects the existence of the inserted battery and then initiates an analysis process. The system can start by pulling battery information associated with the inserted battery from a memory attached to the inserted battery. The system then compares the battery information from the inserted battery with the generated characteristics/patterns (e.g., the "reference information") to see if there is a match (or a substantive match). If so, the system can accordingly generate a customized charging rule (or select one from candidate charging rules) for the inserted battery to achieve a predetermined objective (e.g., increase/maximize battery performance or life span, minimize charging expenses, meet certain predicted demand, etc.) or to meet the assigned demand while achieving one of the predetermined objectives. If not, the system can generate a customized charging rule based on default rules (e.g., identify a closest reference based on the inserted battery's manufacturing information; identify a closest reference based on the inserted battery's usage information; etc.). By this arrangement, the present system can effectively provide suitable, customized charging rules for each inserted battery and accordingly enhance overall system efficiency.

Another aspect of the present disclosure is to provide a battery charging rule in a real-time (e.g., milliseconds to seconds) or near real-time (e.g., minutes to hours) manner. For example, when a user positions a battery in a battery exchange station, the present system can immediately provide a suitable charging rule for that battery. In some embodiments, the system can further adjust the charging rule based on other factors such as a predicted demand of battery, charging cost, user requests/reservations, environmental conditions, future or current events, etc.

For example, the system may accelerate a charging process (e.g., by using a faster charging process with a higher charging rate or charging voltage) at least because it expects a large battery demand in two hours based on user's reservations for batteries. As another example, the system can delay a charging process (e.g., by using/selecting a slower charging rule/profile with a lower charging rate or charging voltage) because there is no immediately need to complete the charging process (e.g., it's in the middle of the night and the system does not expect any immediate battery demand) or because doing so may lower charging expenses (e.g., a power source offers a lower rate during off-peak hours). In some embodiments, for example, the system can prioritize available batteries in a station based on their SoCs. The system can then determine how to charge these batteries based on the characteristics of the batteries (e.g., the characteristics can be represented by charging rules). For example, the system can only charge batteries in a certain SoC range (e.g., 50-80%). For example, assume that it is 10 a.m. now and a predicted demand shows that there will be 4 battery exchanges in Station ST1 at 8 p.m. and there is no predicted battery demand from now to 8 p.m. Station ST1 now has 4 batteries within the 50-80% SoC range. It takes 2 hours for Station ST1 to prepare/charge these 4 batteries to reach an SoC threshold (e.g., 90%). In this example, Station ST1 can plan to start charging these batteries at 6 p.m. Accordingly, the present disclosure is capable of providing suitable charging plans (e.g., based on charging rules and predicted demands) for a battery exchange service provider to achieve various goals (e.g., customer satisfaction, minimize overall charging expenses, etc.).

This disclosure describes systems and methods designed to provide customized battery charging rules in a real-time or near real-time manner. Various embodiments may provide one or more of the following technological improvements: (1) efficient real-time or near real-time battery charging rules ready for a battery exchange station to follow; (2) ability to effectively increase/maximize battery life spans and performances; (3) ability to enable an operator to set up desirable battery charging rules based on multiple factors; and (4) ability to provide enhanced user experiences by offering a satisfying battery experience in an energy-efficient fashion.

In the following description, for the purposes of explanation, numerous specific details are set forth in order to provide a thorough understanding of embodiments of the present technology. It will be apparent, however, that embodiments of the present technology may be practiced without some of these specific details.

FIG. 1 is a schematic diagram illustrating a system 100 in accordance with embodiments of the disclosed technology. The system 100 is configured to (1) collect information from multiple sampling batteries 101 (shown as 101A-C in FIG. 1); (2) generate a plurality of charging rules based on the collected information; and (3) based on the charging rules and predicted battery demand, generate charging plans for a plurality of battery-exchange stations (the charging plans include "battery-specific" charging commands for the station to implement). In some embodiments, the sampling batteries 101 can be selected from all of the batteries owned or managed by an operator of the system 100. The system 100 includes a server 103, a database 105 coupled to the server 103, and a battery exchange station 107. As shown, the battery exchange station 107 can communicate with the server 103 via a wired or wireless communication network 109. Each of the sampling batteries 101 includes a battery memory 113 (shown as 113A-C in FIG. 1). The battery memory 113 is configured to store and record battery information associated with the corresponding sampling battery 101. In some embodiments, the battery memory 113 can be coupled to a controller (e.g., a control chip, a processor, etc., not shown in FIG. 1) attached to the sampling battery 101. The controller can manage the battery information stored in the battery memory 113.

As shown in FIG. 1, the server 103 is configured to (1) collect battery information from the battery memory 113A through the battery exchange station 107 via the network 109; (2) generate a plurality of charging rules based on the collected information; and (3) based on the charging rules and predicted battery demand, generate a charging plan for the battery exchange station 107. In some embodiments, the server 103 can directly receive battery information from the battery memory 113B via the network 109. The server 103 can also receive battery information from the battery memory 113C through a mobile device 111 (e.g., a battery user's smartphone that has an app configured to manage the sampling battery 101C) via the network 109. After collecting the battery information, the server 103 can analyze the collected battery information to determine or identify battery characteristics or patterns that can be used as reference information to select charging rules from the database 105 or to generate customized battery charging rules. In some embodiments, the server 103 can receive battery information via a vehicle (e.g., via a vehicle controller that monitors the battery positioned therein). In some embodiments, the server 103 can receive battery information via a charging device (e.g., a charger that enables a user to charge a battery by household receptacles). Embodiments of the server 103 are discussed in detail below with reference to FIG. 4.

In some embodiments, the server 103 can manage multiple battery-exchange stations 107 based on demand information and the SoCs of the batteries in each of the battery-exchange stations 107. The server 103 can determine a charging plan (and generate charging commands) for each of the exchangeable energy storage devices based on the charging rule.

For example, assume the battery-exchange station 107 has 6 batteries therein (batteries B1-B6). Batteries B1-B6 have SoCs as follows: 92%, 90%, 72%, 65%, 45%, and 30%, respectively. In some embodiments, to provide a satisfying user experience, the system 100 can set a SoC threshold (e.g., 90% SoC or an adjustable threshold between 85% and 95% SoC) so that only batteries that exceed this threshold can be regarded as batteries that can be exchanged or ready to be picked up by a user. In some embodiments, each of the batteries B1-B6 can have a priority value (e.g., to determine which battery is to be exchanged prior to the rest). For example, the priority values of the batteries B1-B6 can be assigned as "1," "2," "3," "4," "5," and "6" according to the SoC (and other characteristics) of each battery. In some embodiments, the batteries B1-B6 can be categorized into two groups while keeping the priority values, "ready to be picked up" (batteries B1 and B2 for having SoC more than 90%) and "not ready" (batteries B3-B6 for having SoC less than 90%). In some embodiments, there can be a third group, such as "locked batteries," which can include batteries that need to be maintained or replaced.

In one example, assume that it takes about 2.5 hours to charge a battery from zero SoC to 90% SoC. The system 100 can get demand information (e.g., predicted battery demands) for at least the next two hours (to allow enough time to charge batteries B1-B6). In other words, the determination of a charging plan for the battery exchange station 107 is based on the predicted demand of the batteries and the required time for fully charging a battery.

Assume that the predicted demand for the next hour is 2 batteries, and the predicted demand for the hour after the next hour is 4 batteries. Therefore, the sever 103 of the system 100 can select the charging rules for the batteries B1-B6 based on the demand information. In this example, the system 100 can determine to (1) maintain the SoCs of batteries B1 and B2; (2) charge batteries B3 and B4 based on a relatively slow charging rule (e.g., their SoCs are close to the 90% threshold; using the relatively slow charging process can decrease heat generated during the process, which is beneficial for battery lives); and (3) charge batteries B5 and B6 based on a relatively fast charging rule (e.g., to meet the predicted demand).

The determination of whether to charge the batteries in the "ready-to-be-picked-up" group is based on available power of the battery-exchange station 107. Also, the available power can also be a factor to determine charging rates of the batteries. In one example, the system 100 can determine to (a) charge batteries B1 and B2 based on a charging rule following which to charge batteries at a constant voltage when the SoC of these batteries are over the SoC threshold; (b) charge batteries B3 and B4 based on a relatively slow charging rule (e.g., charge the batteries at a charging rate of 0.3C when the SoC of the batteries are under 90%, where "C" means the "C-Rate" for battery charging); e.g., the capacity of a battery is commonly rated at "1C," meaning that a fully charged battery rated at 1A-hr should provide 1A for one hour); and (c) charge batteries B5 and B6 with a relatively fast charging rule (e.g., charge the batteries at a charging rate of 0.7C when the SoCs of batteries are under 70%). When the available power is limited in this battery-exchange station 107, the server 103 of the system 100 may generate charging commands based on the selected charge rules and available power of the battery exchange station 107, so that the batteries B5 and B6 may be charged in a rate lower than 0.7C, and the estimated time to fully charge these two batteries can be longer.

In one aspect, the server 103 of the system 100 can send a package of charging commands (e.g., the items (a), (b) and (c) for batteries B1-B6 described above) generated based on a set of charging rules stored in the server 103 to the battery-exchange station 107. By this arrangement, the system 100 can provide various charging schemes to meet the predicted demands, without unnecessarily sacrificing of battery durability (e.g., in the foregoing example, the durability of batteries B5 and B6 are sacrificed for meeting the predicted demand somehow).

In some embodiments, the disclosed technology enables the server 103 to manage a plurality of batteries in various battery-exchange stations 107 by (1) periodically or frequently generating charging commands for these batteries based on the charging rules selected for each of the batteries currently position on the battery exchange station 107; and (2) sending the generated commands to the battery-exchange stations 107. For example, the system 100 can select new charging rule to generate new charging commands for each of the batteries currently positioned in the battery exchange station 107 in response to a triggering event such as an exchange of the exchangeable energy storage devices positioned in the device-exchange station 107, a change to the available power, a change to demand information, or a reservation for the exchangeable energy storage devices positioned in the device-exchange station 107. For example, if that a battery exchange occurs at the battery-exchange station 107 before the server 103 makes its prediction, then the batteries B1 and B2 are provided to a user according to their set priorities (i.e., the priority values assigned), and two batteries with SoCs lower than 50% are returned back to the battery exchange station 107. The demand information remains the same but the situation of the SoCs of the batteries are different. As a result, the server 103 of the system 100 updates the whole charging plan in response to this battery exchange, which may include (1) selecting charging rules for every battery in the battery exchange station 107 and (2) generating new charging commands for the batteries based on the updated charging rules respectively. Embodiments are discussed in detail below.

For example, an associated method can include, for example (S1) calculating the number of batteries in multiple stations (e.g., similar to the station 107); (S2) determining priorities of the batteries (e.g., based on SoCs); and (S3) grouping the batteries based on the priorities. For example, the batteries can be divided into three groups, first, second and third groups. The first group has batteries with 90% or more SoC, the second group has 90% or lower SoC, and a third group has "locked," "non-chargeable" or "non-exchangeable" batteries (due to maintenance/replacement schedules). Using the above-mentioned batteries B1-B6 (with SoCs: 92%, 90%, 72%, 65%, 45%, and 30%) as an example, B1 and B2 are assigned to the first group, and B3-B6 are assigned to the second group. In this example, no batteries are assigned to the third group. B1 has the highest priority, and B6 has the lowest priority. In some examples where there are other significant differences on characteristics of batteries (e.g., age of batteries or cell type of the batteries), the priority can also be adjusted based on these characteristics.

The associated method can further include: (S4) receiving a battery demand prediction in a time interval (e.g., the next two hours or other time intervals in other embodiments). The time interval is determined based on an average of charging time required by the batteries (e.g., two hours). For example, the battery demand prediction for the next hour is "2" (i.e., two battery exchanges are expected), and the battery demand prediction is "4" during the hour after the next hour. In this embodiment, battery B1 and B2 can be used to meet the next hour demand, and batteries B3-B6 can be prepared/charged to meet the demand for the hour after the next hour.

The associated method can further include: (S5) determining available power to charge the batteries (e.g., available power that the battery-exchange station 107 can utilize, an expected power outage, etc.); (S6) based on the priority, selecting a battery to be charged; and (S7) determining/selecting a charging rule for each of the batteries.

Assume that one of the charging rules (namely, the charging rule CR1) include that (a) for batteries with SoC higher than 95% (including 95%), using a "slowest" charging process (e.g., 0.2C); and (b) for batteries with SoC lower than 95%, using a "faster" charging process (e.g., 0.7C). The charging rule CR1 can be chosen when it is required to meet a predicted demand (e.g., unless to meet an urgent demand, it is preferred to use the slower charging process for better battery life expectancy).

Also, another charging rule (namely, the charging rule CR2) can include that (a) charging batteries with SoC higher than 90% (including 90%) at a first charging rate (e.g., 0.2C, the "slowest" charging process); (b) charging batteries with SoC from 60% to 90% at a second charging rate (e.g., 0.4C, a "slower" charging process); and (c) charging batteries with SoC lower than 60% at a third charging rate (e.g., 0.7C, the "faster" charging process). In our example, batteries B5 and B6 are chosen to be charged based on the charging rule CR1 (e.g., it will probably take two hours to fully charge batteries B5 and B6). Batteries B1 and B2 can be charged based on the charging rule CR2 since SoCs of the batteries B1 and B2 exceed the SoC threshold (note that the batteries B1 and B2 can also be charged based on the charging rule CR1 in this example). Batteries B3 and B4 can also be charged based on the charging rule CR2, since it is easy to meet the demand assigned to batteries B3 and B4 using the charging rule CR2.

In some embodiments, the associated method can further include: (S8) determining charging rates (e.g., charging rate "C" discussed above) based on the characteristics of the batteries (e.g., a current temperature, SoC, etc.). This step can be considered as a "fine-tuning" of the charging rules. For example, the method can include using SoC to determine the charging rates for each of the batteries. For example, batteries B1 and B2 (with SoC higher than 90%) can be charged with 0.2C, the "slowest" charging process in reference with the charging rule CR2 that is chosen for batteries B1 and B2 in step (S7). Batteries B3 and B4 (SoC in the range of 89-60%) at the rate of "0.4C." Batteries B5 and B6 (with SoC in the range of 50-0%) at the rate of "0.7C" with reference to the charging rule CR1. In some embodiments, the charging rules further include conditions regarding the temperature of batteries. For example, in condition (c) of the charging rule CR2, the batteries with SoC lower than 60% are charged with the third charging rate (e.g., 0.7C), but if the temperature of the batteries is over a certain temperature threshold (e.g., 50 degree Celsius), the batteries would be charged with the second charging rate (e.g., 0.4C), so as to prevent the batteries from overheating, which may not only damage the batteries, but also affect the user experience.

In some embodiments, the associated method can further include: (S9) adjusting charging rates (e.g., charging rate "C" discussed above) based on other factors such as available power to charge (e.g., as discussed in above-mentioned step S5). In some embodiments, when there is an expected power outage and the device-change station 107 only has limited power to charge the batteries, it can only charge batteries in a certain SoC range (e.g., SoC 50-80%). For example, only batteries B3 and B4 are charged. As another example, there can be only limited power supplied from mains electricity so that the device-exchange station is not capable of charging all the batteries positioned therein based on the corresponding charging rules. Also, there can be multiple battery exchange station units (e.g., a modular design that enables easy, quick expansion) at the same location that need to share available power. In some instances, the power can be supplied by renewable power sources (e.g., solar panels) and the power provided by these sources may vary with time.

In some embodiments, the associated method can further include: (S10) generating charging commands for each of the batteries (e.g., batteries B1-B6) based on the determined charging rules and the adjusted/determined charging rates. The server 103 can then send the generated charging commands to each of the device-exchange stations 107. The device-exchange stations 107 can then implement the charging commands. In other words, each of the charging commands includes the exact value of adjusted/determined charging rate so that the device-exchange stations 107 can charge the batteries positioned therein by the corresponding charging commands. The server 103 can continuously monitor the status of the batteries (SoC, temperature, etc.) and update the charging commands according to the charging rules that correspond to the batteries, respectively.

The foregoing embodiments (e.g., steps S1-S10) discuss how to form "charging plans" for device-exchange stations 107 based on predicted demands for exchangeable energy storage devices. The server 103 can form charging plans for each of the device-exchange stations connected to the server 103, respectively (e.g., the device-exchange station 107). As discussed, the "overall charging plan" can represent how the server 103 can manage (e.g., charge) all the connected device-exchange stations 107 and the energy storage devices therein, so as to meet the demand from users while keeping the energy storage devices healthy and durable. The "charging plan" for each of the device-exchange station can include "charging rules" to be selected and assigned for energy storage devices in the device-exchange station 107. The charging rules describe details of charging an energy storage device (and a corresponding objective that can be achieved thereby). Also, "charging commands" for each of energy storage devices positioned in the device-exchange stations 107 are generated based on the assigned/selected "charging rules" and can be updated frequently based on current conditions of the battery (e.g., SoC, temperature, etc.) and the assigned/selected charging rules.

The database 105 can store information associated with the present disclosure (e.g., demand information, information collected by the server 103, information analyzed by the server 103, information generated by the server 103 (e.g., charging rules, charging plans, or charging commands), reference information, user account information, user battery plans, user histories, user behavior, user driving/riding habits, environmental conditions, event information, etc.). In some embodiments, the database 105 can be a publicly accessible database (e.g., weather forecast database, travel alert database, traffic information database, location service database, map database, etc.) maintained by government or private entities. In some embodiments, the database 105 can be a private database that provides proprietary information (e.g., user account, user credit history, user subscription information, etc.).

The network 109 can be a local area network (LAN) or a wide area network (WAN), but it can also be other wired or wireless networks. The network 109 can be the Internet or some other public or private network. The battery exchange station 107 or the mobile device 111 can be connected to the network 109 through a network interface (e.g., by wired or wireless communication). The server 103 can be coupled to the database 105 via any kind of local, wide area, wired, or wireless network, including the network 109 or a separate public or private network. In some embodiments, the network 109 includes a secured network that is used by a private entity (e.g., a company, etc.).

In some embodiments, the battery exchange station 107 can be configured to collect battery information from the sampling batteries 101 and perform the analysis discussed above. In such embodiments, the battery exchange station 107 can analyze the collected battery information to determine or identify battery characteristics or patterns that can be used as reference information for generating customized battery charging rules. Such reference information can be stored locally (e.g., in the battery exchange station 107) or can be transmitted or uploaded to the server 103. Embodiments of the battery exchange station 107 are discussed in detail below with reference to FIGS. 2 and 3.

Figure 2:
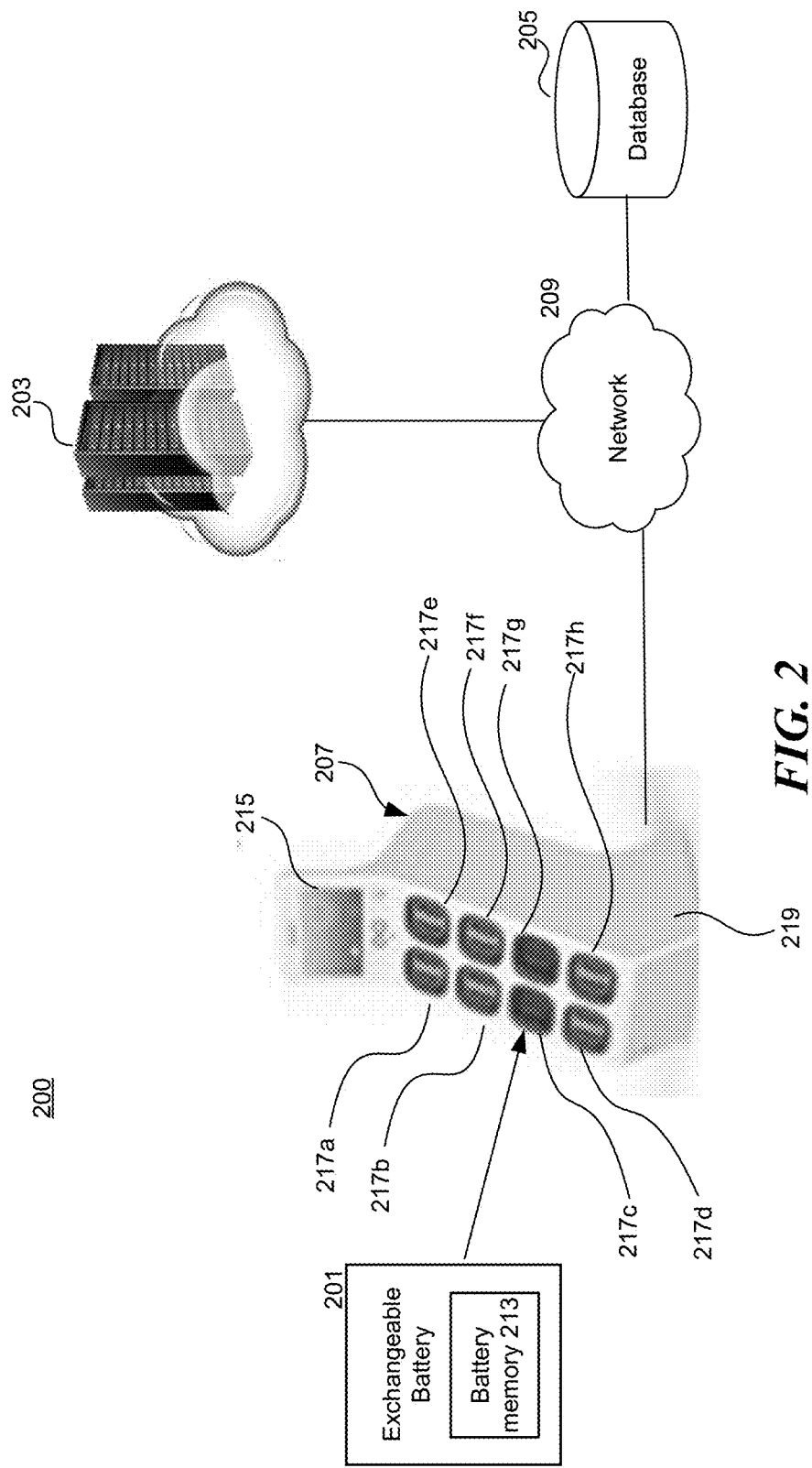
FIG. 2 is a schematic diagram illustrating a system in accordance with embodiments of the disclosed technology. The system is configured to determine a battery charging rule for an exchangeable battery to be charged.

FIG. 2 is a schematic diagram illustrating a system 200 in accordance with embodiments of the disclosed technology. The system 200 is configured to determine a customized battery charging rule or profile for an exchangeable battery 201. The system 200 includes a server 203, a database 205, and a battery exchange station 207. The server 203, database 205, and the battery exchange station 207 can communicate with one another via a network 209. As shown, the battery exchange station 207 includes (i) a display 215 configured to interact with a user, and (ii) a battery rack 219 having eight battery slots 217*a-h* configured to accommodate batteries to be charged.

During operation, there are only six battery slots (e.g., slots 217*a*, 217*b*, 217*d*, 217*e*, 217*f*, and 217*h*) occupied by batteries, and the remaining two slots (e.g., slots 217*c* and 217*g*) are reserved for a user to insert a battery to be exchanged (e.g., low power batteries). The batteries B1-B6 discussed above or the sampling batteries 101A-101C discussed above with reference to FIG. 1 can be positioned in these battery slots 217*a-h*, respectively. In some embodiments, the battery exchange station 207 can have different arrangements such as different numbers of racks, displays, and/or slots. In some embodiments, the battery exchange station 207 can include modular components (e.g., modular racks, modular displays, etc.) that enable an operator to conveniently install or expand the battery exchange station 207. The battery exchange station 207 can be electrically coupled to one or more power sources (e.g., power grid, power lines, power storage, power station/substations, solar cells, wind-powered generators, fuel powered generators, etc.) to receive power to charge the batteries positioned therein and to perform other operations (e.g., to communicate with the server 203). In some embodiments, a user can remove a battery from the battery exchange station 207, without inserting one beforehand. In some embodiments, the battery exchange station 207 can have a locking mechanism for securing the batteries positioned therein. In some embodiments, the battery exchange station 207 can be implemented without the locking mechanism.

As discussed above with reference to FIG. 1, a set of reference information can be generated based on battery information collected from the multiple sampling batteries 101. In some embodiments, the reference information can be stored in the database 205 or the server 203. A user can insert an exchangeable battery 201 (which includes a battery memory 213 configured to store various types of battery information discussed above) into an empty battery slot (e.g., slot 217*c*, as shown in FIG. 2) of the battery exchange station 207. The battery exchange station 207 can collect the battery information and transmit the same to the server 203. The server 203 analyzes the collected battery information and compares it with the stored reference information. The sever 203 accordingly generates a customized battery charging rule for the exchangeable battery 201 to achieve an objective.

In some embodiments, the server 203 can identify one or more characteristics of the exchangeable battery 201 and generates the customized battery charging rule by finding a match (or a general match) from the reference information. In some embodiments, the server 103 can first identify a previous charging rule for the exchangeable battery 201 (e.g., from the collected information) and then adjust it based on the reference information so as to generate the customized battery charging rule for the exchangeable battery 201. For example, a recent analysis/study (which can be part of the reference information) may suggest that the exchangeable battery 201 can perform better if it is charged at a specific temperature for a period of time. The server 103 can accordingly adjust the previous charging rule to generate an updated charging rule.

In some embodiments, the reference information can be stored in the battery exchange station 207. In such embodiments, the battery exchange station 207 can analyze/compare the collected information and the reference information to generate the customized charging rule. The battery exchange station 207 can also locally store/manage a set of generated customized charging rules for future use. In some embodiments, the battery exchange station 207 can upload the generated customized charging rules to the server 203 for future use.

Figure 3:
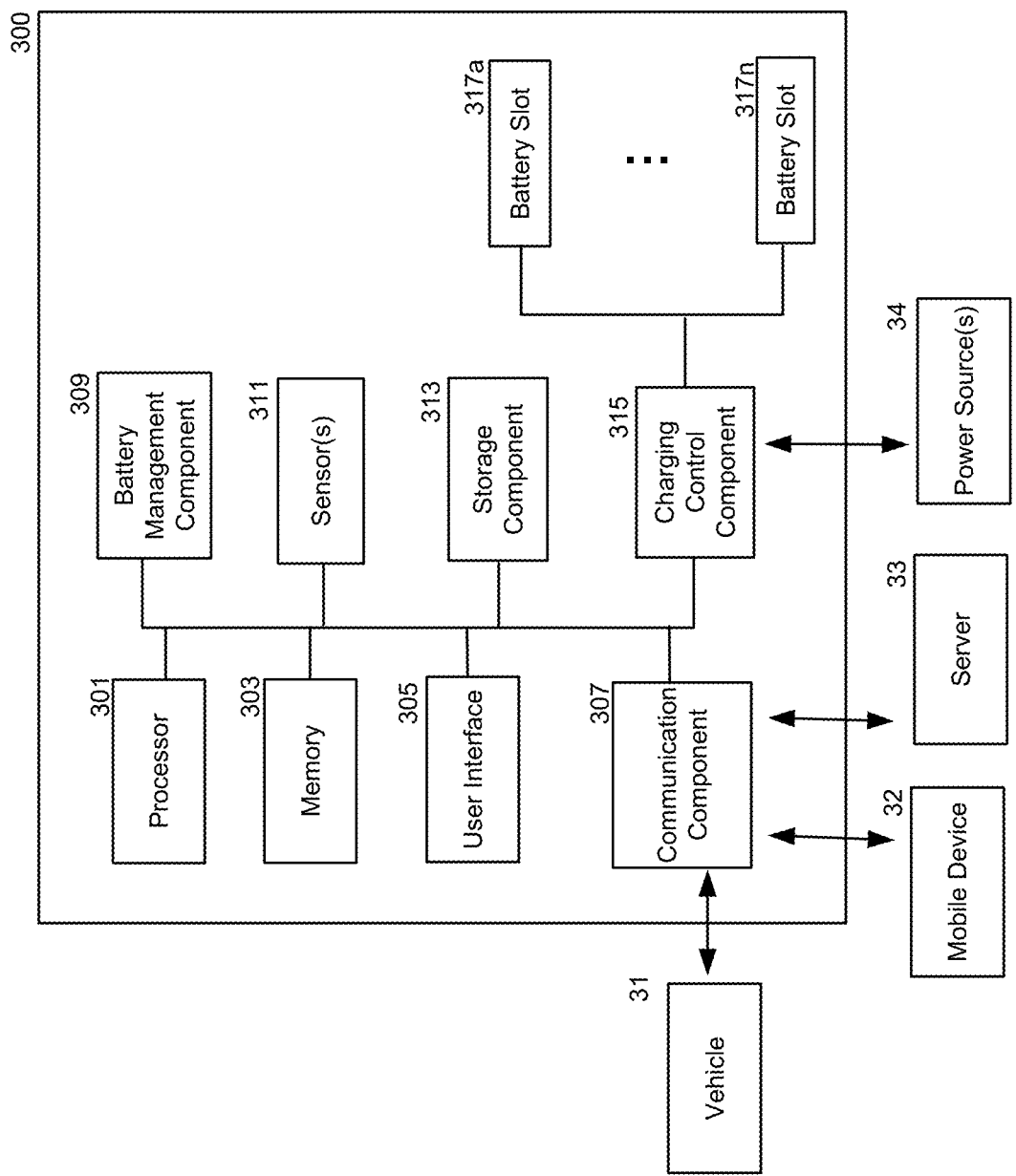
FIG. 3 is a schematic diagram illustrating a station system in accordance with embodiments of the disclosed technology.

FIG. 3 is a schematic diagram illustrating a (charging) station system 300 in accordance with embodiments of the disclosed technology. As shown, the station system 300 includes a processor 301, a memory 303, a user interface 305, a communication component 307, a battery management component 309, one or more sensors 311, a storage component 313, and a charging component 315 coupled to multiple battery slots 317*a-n*. The processor 301 is configured to interact with the memory 303 and other components (e.g., components 305-317) in the station system 300. The memory 303 is coupled to the processor 301 and is configured to store instructions for controlling other components or other information in the station system 300.

The user interface 305 is configured to interact with a user (e.g., receiving a user input and presenting information to the user). In some embodiments, the user interface 305 can be implemented as a touchscreen display. In other embodiments, the user interface 305 can include other suitable user interface devices. The storage component 313 is configured to store, temporarily or permanently, information, data, files, or signals associated with the station system 300 (e.g., information measured by the sensors 313, information collected by the batteries 317a-n, reference information, charging instructions, user information, etc.).

The communication component 307 (e.g., devices suitable for communicating under Bluetooth, infrared, cellular, IEEE 802.11, etc.) is configured to communicate with other systems, such as a vehicle 31 (e.g., an electric vehicle that uses the exchangeable battery 201 as its power source), a mobile device 32 (e.g., a battery user's smartphone that has an app configured to manage the exchangeable battery 201), a server 33 (e.g., the server 103, 203 or the server system 400 to be discussed below with reference to FIG. 4), other station stations, and/or other devices.

The battery management component 309 is configured to collect battery information from various sources and to analyze the collected information. For example, the battery management component 309 can collect information regarding the batteries positioned in the battery slots 317a-n, information regarding the station system 300, information regarding one or more power sources 34, information regarding a user (e.g., received from the mobile device 32 via the communication component 307), and/or information regarding the vehicle 31. In some embodiments, the battery management component 309 can transmit or upload the collected information to the server 33 for further analysis or process. After receiving the battery information, the server 33 can analyze the received battery information and compare it to the reference information so as to generate a customized battery charging rule for batteries to achieve predetermined objectives.

In some embodiments, the battery management component 309 can manage the batteries positioned in the batter slots 317 based on instructions from the server 33 (which can function in the ways similar to the server 103, 303 and the server system 400 to be discussed in detail below with reference to FIG. 4). In some embodiments, the battery management component 309 can periodically communicate with the server 33 to request updated instructions.

In some embodiments, the battery management component 309 can analyze the collected battery information associated with a battery inserted in one of the battery slots 317 and compare the collected battery information with the reference information. The battery management component 309 can accordingly generate a customized battery charging rule for the inserted battery based on the comparison. In some embodiments, the customized battery charging rule can be determined by the server 33.

The charging component 315 is configured to control a charging process for each of the batteries positioned in the battery slots 317a-n. The battery slots 317a-n are configured to accommodate and charge the batteries positioned and/or locked therein. The charging component 315 receives power from the power sources 34 and then uses the power to charge the batteries positioned in the battery slots 317a-n, based on predetermined customized charging rules, either received from the server 33 or generated by the battery management component 309.

In some embodiments, the customized charging rules can be adjusted based on a battery demand prediction generated by the server 33 (e.g., the battery demand prediction can be generated based on predicted user behavior, station characteristics, events close to a battery exchange station, etc.). For example, the station system 300 can delay to implement a battery charging rule if it determines that there is no sufficient power from the power sources 34 to implement the battery charging rule.

The sensors 311 are configured to measure information associated with the station system 300 (e.g., working temperature, environmental conditions, power connection, network connection, etc.). The sensors 311 can also be configured to monitor the batteries positioned in the battery slots 317a-n. The measured information can be sent to the battery management component 309 and/or the server 33 for further analysis. In some embodiments, the measured information can be included in the reference information that is used to generate the customized charging rules. For example, the customized charging rules can vary depending on the temperature surrounding the station system 300 or the temperatures at the battery slots 317.

Figure 4:
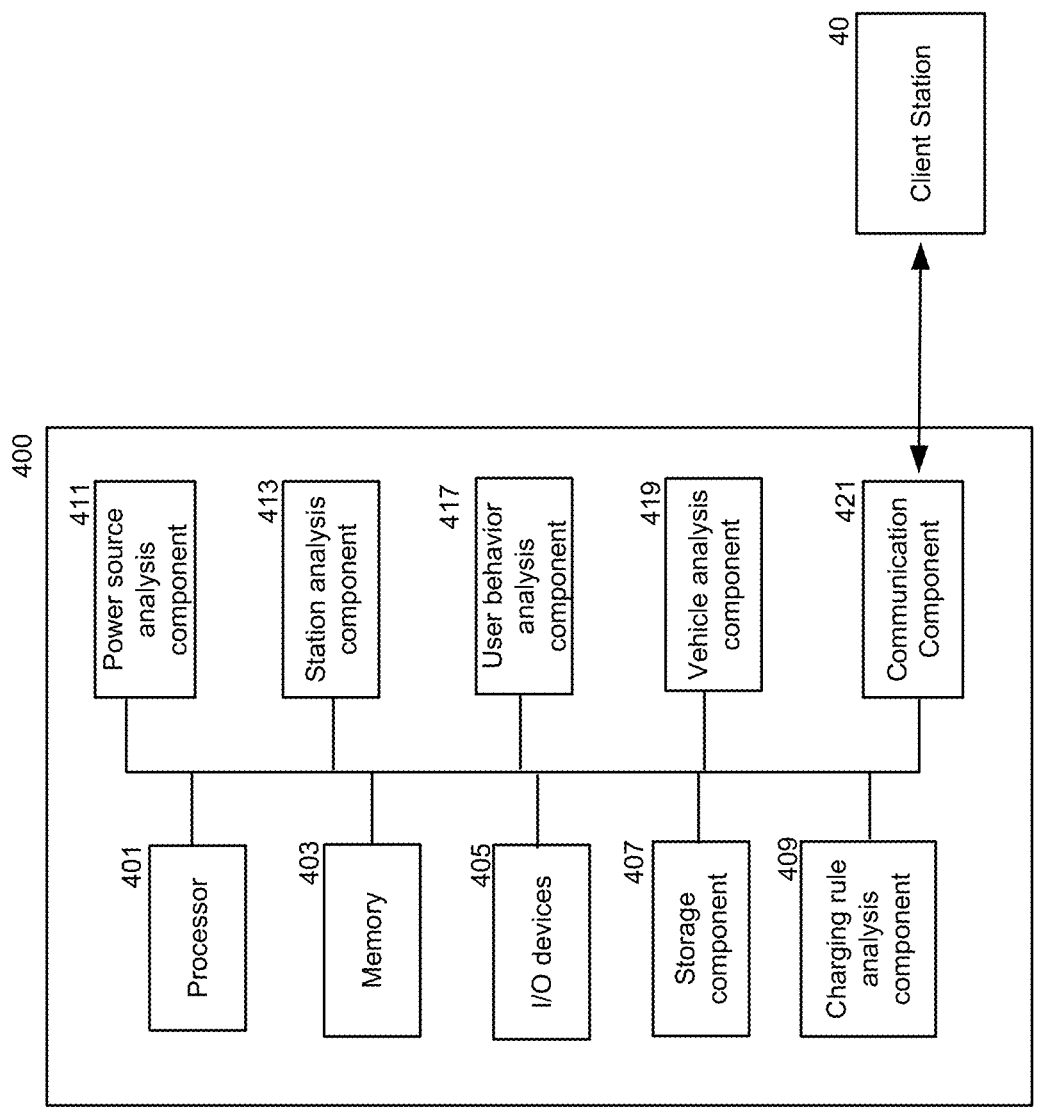
FIG. 4 is a schematic diagram illustrating a server system in accordance with embodiments of the disclosed technology.

FIG. 4 is a schematic diagram illustrating a server system 400 in accordance with embodiments of the disclosed technology. The server system 400 is configured to collect information associated with multiple batteries that can be deployed or managed by the server system 400. The server system 400 is also configured to analyze the collected information and generate, based on the analysis, a customized battery charging rule for a client station 40 to control a charging process therein. In some embodiments, the client station 40 can be implemented as the battery exchange station 107 or 207 discussed above. In other embodiments, the client station 40 can be implemented as other suitable client devices. The server 33, 103 or 203 described above can have a structure, components, and/or elements similar to those of the server system 400.

As shown in FIG. 4, the server system 400 includes a processor 401, a memory 403, input/output (I/O) devices 405, a storage component 407, a charging rule analysis component 409, a power source analysis component 411, a station analysis component 413, a user behavior analysis component 417, a vehicle analysis component 419, and a communication component 421. The processor 401 is configured to interact with the memory 403 and other components (e.g., components 405-421) in the server system 400.

The I/O devices 405 are configured to communicate with an operator (e.g., receive an input therefrom and/or present information thereto). In some embodiments, the I/O devices 405 can be one component (e.g., a touch screen display). In some embodiments, the I/O devices 405 can include an input device (e.g., keyboards, pointing devices, card reader, scanner, camera, etc.) and an output device (e.g., a display, network card, speaker, video card, audio card, printer, speakers, or other external device).

The storage component 407 is configured to store, temporarily or permanently, information, data, files, or signals associated with the server system 400 (e.g., collected information, reference information, information to be analyzed, analysis results, etc.). In some embodiments, the storage component 407 can be a hard disk drive, flash memory, or other suitable storage means. The communication component 421 is configured to communicate with other systems (e.g., the client station 40 or other stations) and other devices (e.g., a mobile device carried by a user, a vehicle, etc.).

The charging rule analysis component 409 is configured to collect and store (e.g., in the storage component 407) battery information to be analyzed. The collected information can be collected from multiple sampling batteries from various sources (e.g., battery exchange stations, electric vehicles, batteries, user mobile devices, etc.). The collected battery information includes, for example, one or more of (1) battery manufacturing information (e.g., battery manufacturers, manufacturing dates, manufacturing batches, manufacturing serial numbers, hardware versions, firmware versions, cell types, etc.), (2) battery characteristic information (e.g., a battery capacity, a battery discharging capacity, a suggested battery working temperature, SOH, etc.); (3)

battery charging information (e.g., SOC information, a current battery temperature, a current cell temperature, a current circuit temperature, an error status, a suggested battery charging temperature, a suggested battery charging current, a suggested battery charging voltage, a suggested battery charging cycle, a suggested battery charging speed, a suggested battery charging time, etc.); (4) battery usage information (e.g., a battery age, a battery internal resistance, an actual battery charging temperature, an actual battery charging current, an actual battery charging voltage, an actual battery charging cycle, an actual battery charging speed, an actual battery charging time, an actual battery working temperature, an actual battery discharging time, etc.), and (5) battery identity information (e.g., a unique battery serial number for each deployed battery). After receiving the collected information, the charging rule analysis component 409 can analyze the collected information.

Each type of collected information above can be analyzed to identify charging characteristics/patterns that may affect a battery's charging process. The identified charging characteristics/patterns can be in a form of characteristic curves/lines shown in FIGS. 5A-5C, to be discussed in detail below). These identified characteristics/patterns can be considered by the charging rule analysis component 409 to generate a battery charging rule for batteries in the client station 40.

In some embodiments, the charging rule analysis component 409 can prioritize the collected information based on their relative importance or reliability. For example, the charging rule analysis component 409 can use the "battery manufacturer" (or types of battery cells, in other embodiments) as a primary factor and set other items as secondary factors when determining a battery charging rule for the client station 40. In such embodiments, the system 400 can identify a charging curve (e.g., as shown in FIGS. 5A-5C, to be discussed in detail below) for the client station 40 based on the manufacturer of the battery to be charged. The charging rule analysis component 409 can then consider other secondary factors to adjust the identified charging curve.

In some embodiments, the charging rule analysis component 409 can give different types of collected information different weightings. For example, the charging rule analysis component 409 can set the weightings for the "state of charge," the "battery charging temperature," and the "charging current" as 50%, 20%, and 30%. In such embodiments, the identified characteristics/patterns for each type of collected information can then be combined based on the foregoing weightings. In some embodiments, the charging rule analysis component 409 can determine which types of collected information to be included based on empirical studies, results of a machine learning process, and/or system operator's preference.

In some embodiments, the charging rule analysis component 409 can determine the priorities or weightings for each type of the collected information based on the reliability of the collected information. For example, for information measured and collected from memories coupled to the batteries, the charging rule analysis can give it higher weighting or priority because the server system 400 considers such information is direct/internal and thus more reliable than indirect/external information such as environmental conditions (e.g., a weather forecast, an event notice, etc.).

In some embodiments, the charging rule analysis component 409 can communicate and work together with other components in the system 400 (e.g., components 411-419) to generate a customized battery charging rule for batteries in the client station 40. In some embodiments, however, the system 400 can operate without components 411-419.

The power source analysis component 411 is configured to analyze the status (e.g., reliability, stability, continuity, etc.) of one or more power sources that are used to power the client station 40 for charging the batteries therein. For example, the power source analysis component 411 can determine that a power source used to supply power to the client station 40 will be interrupted during 1 a.m. to 3 a.m. on a particular date, and then the power source analysis component 411 can accordingly adjust a charging rule. In some embodiments, the power source analysis component 411 can also consider the cost for charging in different time periods. For example, the power source analysis component 411 can determine that the charging cost from a power source is reduced during off-peak hours. The power source analysis component 411 can determine whether it is feasible for the client station 40 to charge its batteries during the off-peak hours. If so, the power source analysis component 411 can adjust the charging rule to reduce charging costs.

The station analysis component 413 is configured to categorize the multiple battery exchange stations into various types and identify representative characteristics/patterns for each type, such that the charging rule analysis component 409 can use such information as basis for its analysis. For example, the station analysis component 413 can analyze the collected information and divide the multiple battery exchange stations into various types based on their battery demands. Based on these types, the charging rule analysis component 409 and the station analysis component 413 can quickly determine a suitable battery charging rule, especially in cases where the collected information is insufficient for the charging rule analysis component 409 to perform a normal analysis.

Similar to the station analysis component 413, the user behavior analysis component 417, and the vehicle analysis component 419 are also configured to categorize the user behavior and vehicles powered by the batteries, respectively, into various types and identify representative characteristics/patterns for each type. The user behavior analysis component 417 can receive a reservation for a battery from a smartphone or other computing device associated with the server and can categorize the user behavior based on how they exchange and/or use the batteries. For example, a user can be very demanding on battery performance (e.g., a professional racer). As another example, another user may only use battery to power its vehicle for daily errands (e.g., picking up children or grocery shopping). If a user reserves a battery at the client station 40, the client station 40 then provides information associated with the reservation to the server system 400. The server system 400 can then determine the type/category of the user who made the reservation and accordingly adjust the battery charging rule for the client station 40. In some embodiments, such adjustment can be made by the client station 40.

The vehicle analysis component 419 can categorize the types of vehicles that users are planning to operate. For each type of vehicles, the vehicle analysis component 419 can determine which types of batteries work best for each type of vehicles. For example, the vehicle analysis component 419 can determine that an electric scooter works best with a specific type of battery after a particular charging process. In such embodiments, the vehicle analysis component 419 can work with (e.g., provide details to) the demand analysis component 409 to adjust the battery demand prediction (and the corresponding charging instructions), if the server system 400 receives related vehicle information. In some embodiments, such information can be found in the user profiles or account information. In other embodiments, such vehicle information can be provided by the client station 40 to the server system 400.

In some embodiments, the server system 400 can generate a customized battery charging rule for the batteries in the client station 40 in a real-time or near real-time manner. In such embodiments, the server system 400 monitors the status of the client station 40. Once there is a change (e.g., a user just removed two fully-charged batteries and left two empty ones at the client station 40) or a potential change (e.g., a user makes a reservation to exchange batteries at the client station 40) that may affect the charging process of the client station 40, the server system 400 can perform the analysis mentioned above and generate an updated battery charging rule for the client station 40 to follow. In some embodiments, the change or potential change can be transmitted to the server system 400 from a mobile device (e.g., a user uses an app installed thereon to make a battery reservation), another server (e.g., a web-service server associated with an app used by a user), and/or the client station 40.

FIGS. 5A-5C are schematic diagrams illustrating battery charging characteristics or patterns in accordance with embodiments of the disclosed technology. FIG. 5A illustrates "step-charge" battery charging profiles (or rules) in accordance with embodiments of the disclosed technology. As shown in FIG. 5A, a battery charging profile 51 can be illustrated based on the relationship between the state of charge (SOC) and the charging current of a battery (or a type of battery). The battery charging profiles 51, 52, and 53 are different types of "step-charge" profiles. When charging a battery based on this type of profile, the battery is charged by different currents in different charging stages. For example, the battery charging profile 51 refers to a charging process wherein the charging current decreases when the battery is close to its full charge capacity. The battery charging profile 52 refers to a charging process having a first portion 52A and a second portion 52B. In the first portion 52A, the charging current remains constant. In the second portion 52B, the charging voltage remains constant (and accordingly the charging current varies). In some embodiments, a charging profile can include two or more stages. For example, the battery charging profile 53 refers to a charging process having a first portion 53A, a second portion 53B, and a third portion 53C. In the first portion 53A and the second portion 53B, the charging currents remain constant. In the third portion 53C, the charging voltage remains constant (and accordingly the charging current varies).

Selecting different charging profiles or rules results in different changing commands. For example, if the system determines that the charging process for battery X is governed by the battery charging profile 51 and assume that the current SoC of battery X is 80% SoC, then the system can generate a corresponding charging command (e.g., to charge battery X at charging current C1 (e.g., 2 Ampere) shown in FIG. 5A or at other voltage). In some embodiments, if the current SoC of battery X is 20% SoC, then the system can generate another charging command (e.g., to charge battery X at charging current C2 (e.g., 15 Ampere). As a result, battery A can be charged at different rates, varying with its SoC. For example, when its SoC is high, it will be charged by a slower charging process. When its SoC is low, it will be charged by a faster charging process.

In some embodiments, the charging profile can be illustrated or characterized by other factors such as a "C-rate." The "C-rate" can be defined as a rate at which a battery is charged (or discharged) relative to its capacity. For example, a battery can have a full capacity of 1000 mA-hour. For this battery, a charging rate of 500 mA corresponds to a C-rate of "0.5," which means, by this charging rate, the battery can increase 50% of its capacity per hour. In some embodiments, the disclosed system can use "C-rate" to characterize charging profiles.

In FIGS. 5B and 5C, six two-dimensional characteristic curves (or lines) 501A-C and 505A-C are shown. In other embodiments, however, the characteristic curves can be three-dimensional or multiple-dimensional, depending on the number of factors to be considered when generating such characteristic curves.

Referring to FIG. 5B, the characteristic curves 501A-C represent charging features for battery A. The charging features are generated (e.g., by a server such as the server system 400 or by a station such as the station system 300) based on information associated with multiple sampling batteries (e.g., the collected information mentioned above). In some embodiments, these characteristic curves 501A-C can be compared with actual measurements so as to verify and/or enhance the accuracy of these curves (e.g., compare the characteristic curve 501A with a curve generated by actual measurement from battery A). In such embodiments, the results of the comparison can be used to further adjust the characteristic curves 501A-C. In some embodiments, the present technology can use this approach to fine-tune its analysis based on various factors, weightings for the factors, algorithms, etc.

As shown in FIG. 5B, the characteristic curve 501A indicates that the battery to be charged is charged in a "step-charge" fashion. The characteristic curve 501B indicates that the charging temperature of the battery to be charged should be decreased when the charging time increases to achieve a pre-determined objective (e.g., increase/maximize battery capacity, longest battery life, etc.). The characteristic curve 501C indicates that the charging current for the battery to be charged should be kept generally the same when charging to achieve the pre-determined objective.

Turning to FIG. 5C, the characteristic curves 505A-C represent charging features for Battery B. The charging features are generated (e.g., by a server such as the server system 400 or by a station such as the station system 300) based on information associated with multiple sampling batteries (e.g., the collected information mentioned above). In some embodiments, these characteristic curves 505A-C can be compared with actual measurements so as to verify and/or enhance the accuracy of these curves (e.g., compare the characteristic curve 505A with a curve generated by actual measurement from Battery B). In such embodiments, the results of the comparison can be used to further adjust the characteristic curves 505A-C. In some embodiments, the present technology can use this approach to fine-tune its analysis based on various factors, weightings for the factors, algorithms, etc.

As shown in FIG. 5C, for example, the characteristic curve 505A indicates that when the SOC increases, the battery exchange station temperature should be decreased to achieve a pre-set goal. The characteristic curve 505B indicates that when the SOC increases, the charging voltage should be decreased "stepwise" to achieve the pre-set goal. As shown in FIG. 5C, without wishing to be bonded by theory, the characteristic curve 505C includes a peak portion 507. The peak portion 507 indicates that when the SOC of Battery B reaches certain levels, the charging current can be increased so as to achieve the pre-set goal.

In some embodiments, the present technology can provide multiple types of characteristic curves or patterns that can be used as reference information to determine how to charge a particular battery to achieve an objective or a goal. In some embodiments, the objective or goal can be determined based on financial reasons (e.g., to reduce operation expenses), customer satisfaction (e.g., to provide highest possible battery experience to a user), or other suitable factors. In some embodiments, the charging rules/profiles can be represented by one or more conditions, criteria, and/or parameters (e.g., characteristics of the batteries or characteristics of the device-exchange stations) and are not limited to the curves shown in FIGS. 5A-5C.

Figure 6:
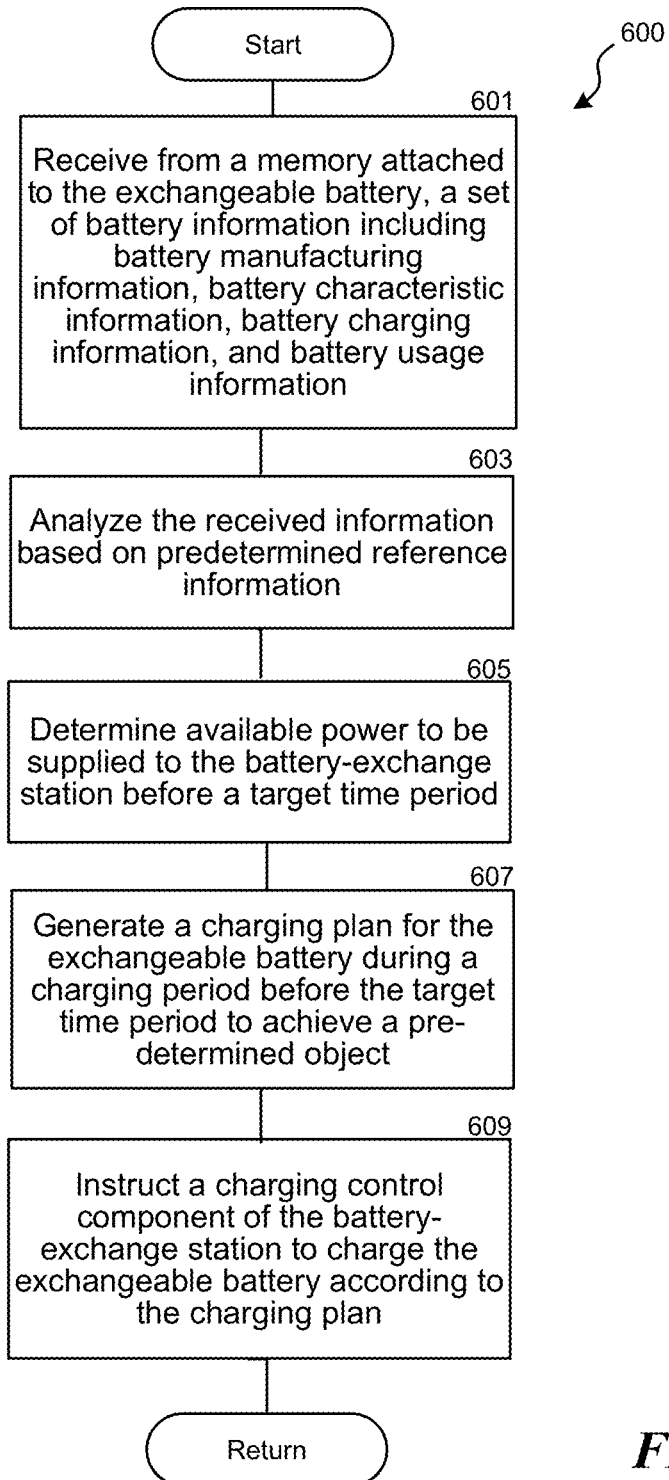
FIG. 6 is a flowchart illustrating a method (e.g., performed by a programmed processor) in accordance with embodiments of the disclosed technology.

FIG. 6 is a flowchart illustrating a method 600 in accordance with embodiments of the disclosed technology. The method 600 is configured to generate a charging rule for an exchangeable battery positioned in a battery-exchange station. The method 600 is also configured to instruct the station to charge the exchangeable battery based on the generated charging rule. The method 600 can be implemented (1) by a server (e.g., the server system 400 discussed above) with a battery exchange station (e.g., the station system 300) or (2) by a battery exchange station alone. The method 600 starts at block 601 by receiving from a memory attached to the exchangeable battery (e.g., a battery to be charged), a set of battery information. The battery information includes battery manufacturing information, battery characteristic information, battery charging information, and battery usage information.

At block 603, the method 600 continues by analyzing the received information based on predetermined reference information. In some embodiments, the predetermined reference information is generated based on information collected from multiple sampling batteries. The sampling batteries and the exchangeable battery have at least one characteristic in common, and therefore the present technology can use this characteristic in common to determine which part of the collected information (and also how much weighting should be assigned thereto) is going to be used to determine a charging rule for the exchangeable battery.

At block 605, the method 600 then determines available power to be supplied to each of the battery exchange station before a target time period. At block 607, a charging rule for the exchangeable battery is generated to achieve a predetermined objective. The charging rule is to be implemented during a charging period which is before the target time period.

At block 609, the method 600 includes instructing a charging control component of the battery-exchange station to charge the exchangeable battery according to the charging rule (e.g., by sending corresponding charging commands to the battery-exchange station or by sending corresponding charging commands to a charging control component from a processor of the battery-exchange station). The method 600 then returns and waits for further instructions.

In some embodiments, the charging rules described therein can be characterized, determined, defined, predicted, and/or "trained" based on historical data collected by the disclosed system and can be further adjusted based on updated data (e.g., new battery usage data, new user behavior data, etc.). In some embodiments, the charging rules can be updated every day/week/month/season based on the updated data.

Figure 7:
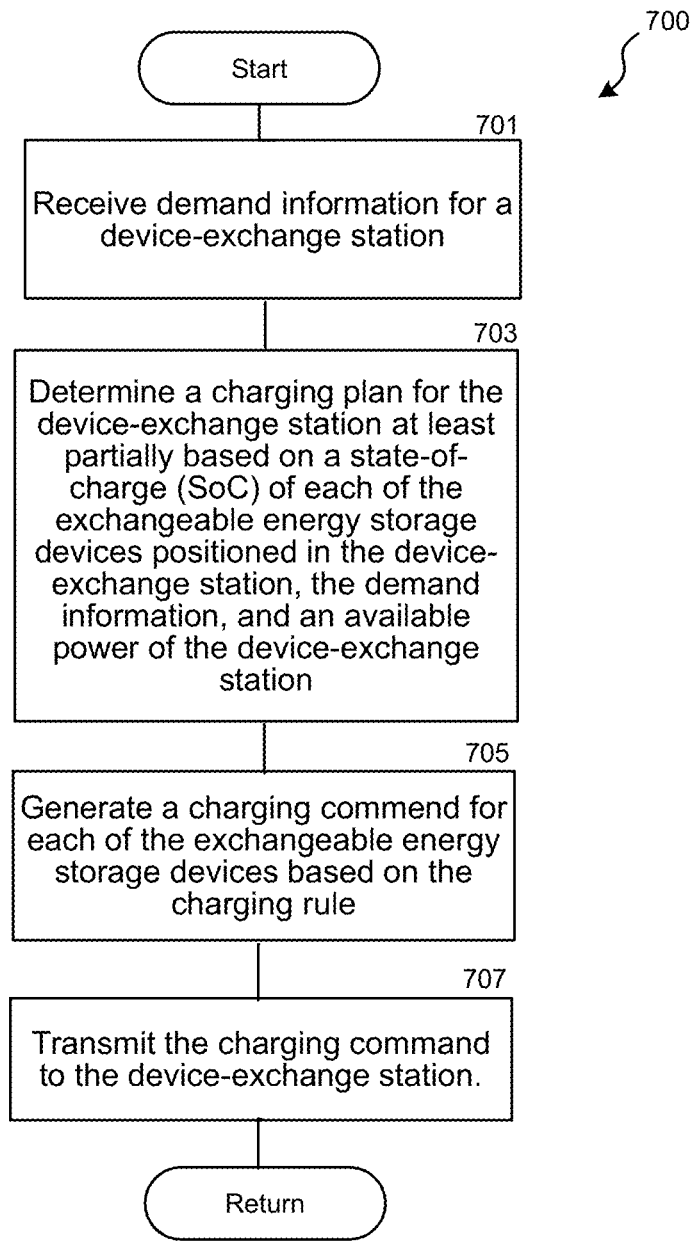
FIG. 7 is a flowchart illustrating a method (e.g., performed by a programmed processor) in accordance with embodiments of the disclosed technology.

FIG. 7 is a flowchart illustrating a method 700 in accordance with embodiments of the disclosed technology. The method 700 is for charging exchangeable energy storage devices (e.g., batteries) positioned in a device-exchange station. The method 700 can be implemented by a server (e.g., the server system 400 discussed above). The method 700 starts at block 701 by receiving demand information for the device-exchange station. At block 703, the method 700 continues by determining a charging plan for the device-exchange station at least partially based on a state-of-charge (SoC) of each of the exchangeable energy storage devices positioned in the device-exchange station, the plurality of predicted exchange demands, and an available power of the device-exchange station (e.g., from a power source, a power grid, etc.). The charging plan includes at least one charging rule for each of the exchangeable energy storage devices positioned in the device-exchange station.

At block 705, the method 700 generates a charging command for each of the exchangeable energy storage devices based on the charging rule. At block 707, the method 700 continues by transmitting the charging command to the device-exchange station. In some embodiments, the method 700 includes periodically updating the charging plan or updating the charging plan in response to a triggering event. In some embodiments, the triggering event includes an exchange of the exchangeable energy storage devices positioned in the device-exchange station, a change to the available power, and/or a reservation for the exchangeable energy storage devices positioned in the device-exchange station.

In some embodiments, the charging plan (e.g., for a station) is determined at least partially based on a type (e.g., the types of batteries as discussed above) of the energy storage devices of the device-exchange station. Based on the charging plan, the system can determine one or more suitable charging rules for each of the energy storage devices. The system can then generate charging commands (e.g., particular instructions for the station to implement) and transmit the same to the device-exchange station.

In some embodiments, the charging command can be generated at least partially based on a charger type of a charger positioned in the device-exchange station (e.g., battery exchange stations 107, 207, station system 300 or client station 40). The charger is configured to charge one or more of the energy storage devices. For example, the charger type can include a one-versus-one type (e.g., one battery, one charger), a two-versus-one type (e.g., two batteries share one charger), or a four-versus-one type (e.g., four batteries share one charger). In such embodiments, the system considers the availability of charger when it determines the charging plan. For example, referring to FIG. 2, the slots 217d, 217h can share one charger, and accordingly there is one battery in the slots 217d, 217h can be charged at one time.

In some embodiments, the device-exchange station (e.g., battery exchange stations 107, 207, station system 300 or client station 40) can be a first device-exchange station, and the method can include determining the charging plan for the first device-exchange station at least partially based on a status of a second device-exchange station adjacent to or near by the first device-exchange station. For example, when the service provided by the second device-exchange station is interrupted (e.g., due to a maintenance event or a power outage), the system can adjust its charging plan for the first station to address the predicted demands for the second station.

In some embodiments, the method can include assigning a priority value to each of the exchangeable energy storage devices (e.g., based on their SoCs) positioned in the device-exchange station. The method can also include determining the charging plan for the device-exchange station at least partially based on the priority value. Please refer to the foregoing embodiments associated with batteries B1-B6. Based on the priority values, the system can determine which batteries to be charged first and exchanged first.

Although the present technology has been described with reference to specific exemplary embodiments, it will be recognized that the present technology is not limited to the embodiments described but can be practiced with modification and alteration within the spirit and scope of the appended claims. Accordingly, the specification and drawings are to be regarded in an illustrative sense rather than a restrictive sense.

The invention claimed is:

1. A method for charging exchangeable energy storage devices positioned in a device-exchange station, the method comprising:
   receiving demand information for the device-exchange station;
   determining a charging plan for the device-exchange station at least partially based on a state-of-charge (SoC) of each of the exchangeable energy storage devices positioned in the device-exchange station, the demand information, and an available power of the device-exchange station, the charging plan including at least one charging rule for each of the exchangeable energy storage devices positioned in the device-exchange station;
   generating a charging command for each of the exchangeable energy storage devices based on the charging rule for each of the exchangeable energy storage devices; and
   transmitting the charging commands to the device-exchange station.

2. The method of claim 1, further comprising:
   periodically updating the charging plan for the device-exchange station; and
   updating the charging plan in response to the triggering event on the device-exchange station.

3. The method of claim 1, further comprising customizing the at least one charging rule for each of the exchangeable energy storage devices based on a predetermined objective.

4. The method of claim 3, further comprising adjusting the charging plan based on an economic condition.

5. The method of claim 1, wherein the charging plan is determined at least partially based on a type of the energy storage devices of the device-exchange station.

6. The method of claim 5, wherein the type of the device-exchange station includes a public type, a semi-private type, or a private type.

7. The method of claim 1, wherein the charging command is generated at least partially based on a charger type of a charger positioned in the device-exchange station.

8. The method of claim 7, wherein the charger type includes a one-versus-one type, a two-versus-one type, or a four-versus-one type.

9. The method of claim 1, wherein the device-exchange station is a first device-exchange station, and wherein the method comprises:
   determining the charging plan for the first device-exchange station at least partially based on a status of a second device-exchange station adjacent to the first device-exchange station.

10. The method of claim 9, wherein the status of the second device-exchange station includes a normal status or a service-interrupted status, and wherein the service-interrupted status results from a maintenance event or a power outage.

11. The method of claim 1, further comprising:
    assigning a priority value to each of the exchangeable energy storage devices positioned in the device-exchange station; and
    determining the charging plan for the device-exchange station at least partially based on the priority value and the demand information.

12. The method of claim 11, wherein the priority value is determined based on the SoC of each of the exchangeable energy storage devices positioned in the device-exchange station.

13. The method of claim 1, further comprising:
    categorizing the exchangeable energy storage devices positioned in the device-exchange station into a first group, a second group, and a third group, wherein the first group includes the exchangeable energy storage devices that have more than an SoC threshold and that are not locked, and wherein the second group includes the exchangeable energy storage devices that have less than the SoC threshold and that are not locked, and wherein the third group includes the exchangeable energy storage devices that are locked; and
    determining the charging plan for the device-exchange station at least partially based on numbers exchangeable energy storage devices in the first group, the second group, and the third group.

14. The method of claim 1, wherein the demand information includes a first demand prediction for a first hour and a second demand prediction for a second hour following the first hour.

15. The method of claim 14, further comprising:
    assigning a priority value to each of the exchangeable energy storage devices positioned in the device-exchange station; and
    determining the charging plan for the device-exchange station at least partially based on the priority value and the first demand prediction and the second demand prediction.

16. The method of claim 1, wherein the at least one charging rule is determined based on one or more characteristics of the exchangeable energy storage devices, and wherein the one or more characteristics incudes a current temperature, battery manufacturing information, battery characteristic information, battery charging information or battery usage information.

17. The method of claim 1, wherein the at least one charging rule includes a first charging rule or a second charging rule, and wherein the method further comprises determining whether to use the first charging rule or the second charging rule based on the demand information, where in the first charging rule corresponds to a first charging rate greater than a second charging rate corresponding to the second charging rule.

18. A server comprising:
    a processor configured to—
        receive demand information for a device-exchange station;
        determine a charging plan for the device-exchange station at least partially based on a state-of-charge (SoC) of each of exchangeable energy storage devices positioned in the device-exchange station, the demand information, and an available power of the device-exchange station, the charging plan including at least one charging rule for each of the exchangeable energy storage devices positioned in the device-exchange station;

generate a charging command for each of the exchangeable energy storage devices based on the charging rule for each of the exchangeable energy storage devices; and transmit, via a communication component, the charging commands to the device-exchange station.

19. The system of claim 18, wherein the processor is configured to update the charging plan in response to a triggering event, and wherein the triggering event includes an exchange of the exchangeable energy storage devices positioned in the device-exchange station, a change to the available power, a change to the demand information, or a reservation for the exchangeable energy storage devices positioned in the device-exchange station.

20. A method for managing a device-exchange station, the method comprising:

receiving a plurality of predicted exchange demands for the device-exchange station;

determining a charging plan for the device-exchange station at least partially based on a state-of-charge (SoC) and a temperature of each of the exchangeable energy storage devices positioned in the device-exchange station, the plurality of predicted exchange demands, and an available power of the device-exchange station, the charging plan including at least one charging rule for each of the exchangeable energy storage devices positioned in the device-exchange station;

generating a charging command for each of the exchangeable energy storage devices based on the charging rule for each of the exchangeable energy storage devices; and transmitting the charging commands to the device-exchange station.

* * * * *